United States Patent
Guo et al.

(10) Patent No.: US 12,303,990 B2
(45) Date of Patent: May 20, 2025

(54) CIRCUIT BOARD ASSEMBLY SOLDERING APPARATUS AND CIRCUIT BOARD ASSEMBLY SOLDERING METHOD

(71) Applicant: Honor Device Co., Ltd., Shenzhen (CN)

(72) Inventors: Jianqiang Guo, Shenzhen (CN); Wenjun Luo, Shenzhen (CN); Mingchuan Li, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/042,050

(22) PCT Filed: Sep. 14, 2022

(86) PCT No.: PCT/CN2022/118796
§ 371 (c)(1),
(2) Date: Feb. 17, 2023

(87) PCT Pub. No.: WO2023/061139
PCT Pub. Date: Apr. 20, 2023

(65) Prior Publication Data
US 2024/0269759 A1    Aug. 15, 2024

(30) Foreign Application Priority Data
Oct. 13, 2021    (CN) .......................... 202111189553.2

(51) Int. Cl.
*B23K 1/00*    (2006.01)
*B23K 1/005*    (2006.01)
(Continued)

(52) U.S. Cl.
CPC .......... *B23K 1/0016* (2013.01); *B23K 1/0056* (2013.01); *B23K 3/047* (2013.01);
(Continued)

(58) Field of Classification Search
None
See application file for complete search history.

(56) References Cited

U.S. PATENT DOCUMENTS

| | | | |
|---|---|---|---|
| 2007/0099412 A1 | 5/2007 | Miyazaki | |
| 2007/0181543 A1 | 8/2007 | Urairi et al. | |

(Continued)

FOREIGN PATENT DOCUMENTS

| | | |
|---|---|---|
| CN | 105328384 A | 2/2016 |
| CN | 205200751 U | 5/2016 |

(Continued)

*Primary Examiner* — Devang R Patel
(74) *Attorney, Agent, or Firm* — Rimon PC

(57) ABSTRACT

This application provides a circuit board assembly soldering apparatus and corresponding method. The soldering apparatus is provided with at least two bearing seats on a base plate, the bearing seats are located in a space between the base plate and a pressing plate assembly, the bearing seats each include a workbench, the workbench is located on a side of the bearing seat that faces the pressing plate assembly, a circuit board assembly is placed on the workbench. At least one adjustable bearing seat is provided, and a spacing between the workbench of the adjustable bearing seat and the base plate is adjustable. Further, a spacing between the workbench of the adjustable bearing seat and the pressing plate assembly is adjusted, to implement soldered connection between circuit board assemblies with different thicknesses, and the soldering apparatus can connect at least two circuit board assemblies by soldering at a single time.

18 Claims, 11 Drawing Sheets

(51) Int. Cl.
   *B23K 3/047*   (2006.01)
   *B23K 3/08*    (2006.01)
   *H05K 3/36*    (2006.01)
   *B23K 101/42*  (2006.01)

(52) U.S. Cl.
   CPC ............. *B23K 3/087* (2013.01); *H05K 3/363* (2013.01); *B23K 2101/42* (2018.08); *H05K 2203/0147* (2013.01)

(56) References Cited

U.S. PATENT DOCUMENTS

| | | |
|---|---|---|
| 2008/0067160 A1 | 3/2008 | Suutarinen |
| 2013/0062326 A1 | 3/2013 | Morelle et al. |
| 2020/0101549 A1 | 4/2020 | Hutzler et al. |
| 2022/0410298 A1* | 12/2022 | Choi ................. B23K 26/0608 |

FOREIGN PATENT DOCUMENTS

| | | | | |
|---|---|---|---|---|
| CN | 107710887 A | | 2/2018 | |
| CN | 107949178 A | * | 4/2018 | ............. B23K 26/21 |
| CN | 109121323 A | | 1/2019 | |
| CN | 109834359 A | | 6/2019 | |
| CN | 209303981 U | | 8/2019 | |
| CN | 209614497 U | | 11/2019 | |
| CN | 211305139 U | | 8/2020 | |
| CN | 211991339 U | * | 11/2020 | |
| CN | 212704895 U | * | 3/2021 | |
| CN | 213080344 U | | 4/2021 | |
| CN | 113038733 A | | 6/2021 | |
| CN | 113618192 A | | 11/2021 | |
| JP | H0422591 A | | 1/1992 | |
| JP | H04137795 A | | 5/1992 | |
| JP | H07335697 A | | 12/1995 | |
| TW | 200939370 A | | 9/2009 | |
| WO | 2007043884 A2 | | 4/2007 | |
| WO | 2021100960 A1 | | 5/2021 | |

* cited by examiner

CIRCUIT BOARD ASSEMBLY SOLDERING APPARATUS AND CIRCUIT BOARD ASSEMBLY SOLDERING METHOD

CROSS-REFERENCE TO RELATED APPLICATIONS

This application is a national stage of International Application No. PCT/CN2022/118796, filed on Sep. 14, 2022, which claims priority to Chinese Patent Application No. 202111189553.2, filed on Oct. 13, 2021. The disclosures of both of the aforementioned applications are hereby incorporated by reference in their entireties.

TECHNICAL FIELD

This application relates to the field of soldering device technologies, in particular, to a circuit board assembly soldering apparatus and a circuit board assembly soldering method.

BACKGROUND

In modern life, mobile terminals such as mobile phones, notebook computers, and smart watches play increasingly important roles in people's daily life, work contact, and other scenarios, and have gradually become necessities of modern life.

A mobile terminal usually includes a screen assembly, a housing, a battery, a mainboard, and other parts. The battery and the mainboard are provided in a space enclosed by the screen assembly and the housing. The mainboard is usually a printed circuit board (Printed Circuit Board, PCB for short), and various components are provided on the mainboard. Some parts of the mobile terminal need to be electrically connected to some components on the mainboard. Other parts of the mobile terminal may be electrically connected to components on the mainboard through a flexible printed circuit (Flexible Printed Circuit, FPC for short). In practical operations, a laser soldering technology may be used, the FPC is first soldered on the mainboard by using a soldering device, and then the FPC is connected to the other parts of the mobile terminal.

However, an existing soldering device can solder and connect only a single FPC to a single PCB each time of soldering, and soldering efficiency is low.

SUMMARY

This application provides a circuit board assembly soldering apparatus and a circuit board assembly soldering method. The circuit board assembly soldering apparatus can connect a plurality of FPCs to a plurality of PCBs by soldering at a single time, and therefore have high soldering efficiency.

According to one aspect, this application provides a circuit board assembly soldering apparatus, including a base plate, a pressing plate assembly, and at least two bearing seats, where the pressing plate assembly is oppositely provided above the base plate, the bearing seats are mounted on the base plate, and the bearing seats are located between the pressing plate assembly and the base plate; and the bearing seats each include a workbench, the workbench is located on a side of the bearing seat that faces the pressing plate assembly, the workbench is configured to place a circuit board assembly, and the pressing plate assembly is configured to be pressed on the circuit board assembly located on the workbench; where
the at least two bearing seats include at least one adjustable bearing seat, and a spacing between the workbench of the adjustable bearing seat and the base plate is adjustable.

According to the circuit board assembly soldering apparatus provided in this application, at least two bearing seats are provided on the base plate, the bearing seats are located in a space between the base plate and the pressing plate assembly, the bearing seats each include the workbench, the workbench is located on the side of the bearing seat that faces the pressing plate assembly, the circuit board assembly is placed on the workbench, and the pressing plate assembly is pressed on the circuit board assembly on the workbench, so as to provide pressure on the circuit board assembly and implement soldered connection of the circuit board assembly. At least one adjustable bearing seat is provided, and a spacing between the workbench of the adjustable bearing seat and the base plate is adjustable. Further, a spacing between the workbench of the adjustable bearing seat and the pressing plate assembly is adjusted, to implement soldered connection between circuit board assemblies with different thicknesses. With the circuit board assembly placed on each bearing seat, the soldering apparatus can connect at least two circuit board assemblies by soldering at a single time, and therefore have high soldering efficiency.

In a possible implementation, the bearing seats each further include a support frame, the support frame is connected between the workbench and the base plate, and the support frame of the adjustable bearing seat is capable of adjusting a height of the workbench relative to the base plate.

With the support frame mounted on the base plate, the support frame is used to support the workbench over the base plate, to form a soldering workspace between the workbench and the pressing plate assembly. In addition, the support frame of the adjustable bearing seat can adjust the height of the workbench, to adjust the spacing between the workbench and the pressing plate assembly based on thicknesses of different circuit board assemblies, so that pressure applied to the circuit board assembly meets a soldering pressure requirement.

In a possible implementation, the support frame of the adjustable bearing seat includes at least one support column, and the support column is supported on the base plate.

The workbench of the adjustable bearing seat is supported by using the support column, and the height of the workbench relative to the base plate is adjusted by using the support column, so as to adjust the height of the workbench, and adjust the spacing between the workbench and the pressing plate assembly.

In a possible implementation, the workbench of the adjustable bearing seat is fastened to a top end of the support column, and a height of the support column of the adjustable bearing seat is adjustable.

The workbench of the adjustable bearing seat is fastened to the top end of the support column that faces away from the base plate. The support column is provided as a support column with an adjustable height. The height of the support column is adjusted, so that the support column drives the workbench to move, to adjust the height of the workbench.

In a possible implementation, the workbench of the adjustable bearing seat is movably connected to the support column and is capable of moving along an axial direction of the support column, and the workbench of the adjustable bearing seat is capable of being fastened to different parts of the support column.

The support column is provided as a fixed structure, and the workbench is movably connected to the support column. The support column guides movement of the workbench, so that the workbench moves along the axial direction of the support column, and the workbench can be fastened to different parts of the support column, to adjust the height of the workbench relative to the base plate.

In a possible implementation, a telescopic elastic part is sleeved outside the support column of the adjustable bearing seat, the support column is inserted into the workbench, and both ends of the elastic part respectively abut against the workbench and the base plate.

With the support column inserted into the workbench and the telescopic elastic part sleeved outside the support column, the elastic part abuts against the workbench and the base plate and is arranged in between. An expansion amount of the elastic part is adjusted, so that the elastic part drives the workbench to move, to adjust the height of the workbench.

In a possible implementation, the workbench of the adjustable bearing seat is internally provided with a pressure sensor.

With the workbench of the adjustable bearing seat internally provided with the pressure sensor, the pressure sensor is used to detect pressure borne by the circuit board assembly to adjust the height of the workbench, so that the pressure borne by the circuit board assembly is within a proper range.

In a possible implementation, the at least two bearing seats include one fixed bearing seat, and a spacing between the workbench of the fixed bearing seat and the base plate is fixed.

With the fixed bearing seat provided, a height of the workbench of the fixed bearing seat cannot be adjusted. When a plurality of circuit board assemblies are simultaneously soldered, the height of the workbench of each adjustable bearing seat can be adjusted by using the workbench of the fixed bearing seat as reference. In addition, when only one circuit board assembly is soldered at a single time, the circuit board assembly may be placed on the fixed bearing seat to simplify an operation for adjusting soldering pressure and improve soldering efficiency. In addition, the soldering apparatus may be reconstructed on the basis of the original soldering apparatus having one fixed bearing seat.

In a possible implementation, the pressing plate assembly is provided with a pressure sensor, or the workbench of the fixed bearing seat is provided with a pressure sensor.

A pressure sensor is provided on the pressing plate assembly or in the workbench of the fixed bearing seat to detect a value of pressure between the workbench of the fixed bearing seat and the pressing plate assembly, so as to adjust a height of the pressing plate assembly based on this reference. After the pressing plate assembly is positioned, the height of the workbench of each adjustable bearing seat is adjusted based on a detected value of the pressure sensor in the workbench of each adjustable bearing seat.

In a possible implementation, the pressing plate assembly includes a substrate, the substrate is provided opposite to the base plate, and projections of the workbenches of all the bearing seats on the substrate each are located within a coverage area of the substrate.

With the substrate capable of covering all the bearing seats provided, the substrate is configured to be pressed on the circuit board assemblies on the workbenches of the bearing seats, and the substrate is configured to transmit laser light emitted by a laser, so that the laser light is irradiated onto surfaces of the circuit board assemblies on the workbenches.

In a possible implementation, the pressing plate assembly further includes at least two separate plates, each of the separate plates is provided on a surface on a side of the substrate that faces the base plate, the separate plates are in a one-to-one correspondence with the workbenches of the bearing seats, and the separate plates are pressed on the circuit board assemblies on the workbenches; where a spacing exists between adjacent separate plates.

With each of the separate plates provided on the surface on the side of the substrate that faces the base plate, the separate plates are in a one-to-one correspondence with the workbenches of the bearing seats, and the circuit board assemblies are pressed between the separate plates and the workbenches. By providing the separate plates, strength of the pressing plate assembly can be increased, a pressure bearing capability of the pressing plate assembly can be improved, and reliability of the soldering apparatus can be improved. In addition, with the spacing between adjacent separate plates provided, a space between adjacent separate plates forms an avoidance space. The avoidance space can avoid some structural members on the circuit board assembly that are located outside a soldering region.

In a possible implementation, the soldering apparatus further includes at least one laser, where the at least one laser is provided on a side of the pressing plate assembly that faces away from the base plate, and laser light emitted by the at least one laser penetrates the pressing plate assembly and is irradiated onto the circuit board assemblies on the workbenches.

The laser is arranged on the side of the pressing plate assembly that faces away from the base plate, and the laser light emitted by the laser penetrates the pressing plate assembly and is irradiated onto the circuit board assembly on the workbench. The circuit board assembly is heated by energy of the laser light, so that the circuit board assembly experiences a temperature rise. Solder paste on a PCB is melted, and the molten solder paste is squeezed and overflows to a surface on a side of an FPC that faces away from the PCB, to implement soldered connection between the FPC and the PCB.

In a possible implementation, the soldering apparatus includes at least two lasers, where each of the lasers is provided on the side of the pressing plate assembly that faces away from the base plate, and an out-light surface of each of the lasers is in a one-to-one correspondence with each of the workbenches.

With the plurality of lasers provided on the pressing plate assembly, each laser is in a one-to-one correspondence with each workbench of each bearing seat, and laser light emitted by each laser is concentrated and irradiated onto each circuit board assembly. This can improve heating efficiency of the circuit board assembly and increase a soldering speed of the circuit board assembly.

In a possible implementation, the soldering apparatus includes at least two lasers, where the at least two lasers include at least one first laser and at least one second laser; and the first laser is provided on the side of the pressing plate assembly that faces away from the base plate; and the second laser is provided on a side of the pressing plate assembly that faces the base plate, and the second laser is located in a gap between adjacent bearing seats.

With the first laser provided on the side of the pressing plate assembly that faces away from the base plate, laser light emitted by the first laser penetrates the pressing plate assembly and is irradiated onto the circuit board assembly on each workbench, and is used to heat the circuit board assembly. With the second laser provided on the side of the pressing plate assembly that faces the base plate, the second laser is located in the gap between adjacent bearing seats, and laser light emitted by the second laser is irradiated onto a region of a PCB that is located in a gap between adjacent workbenches, and is used to cut the PCB.

In a possible implementation, the soldering apparatus includes a plurality of lasers, where the plurality of lasers include at least two third lasers, each of the third lasers is provided corresponding to each of the bearing seats, the third laser is located between the workbench and the base plate, an out-light surface of the third laser faces the workbench, and laser light emitted by the third laser penetrates the workbench and is irradiated onto the circuit board assembly.

With the third laser provided on each bearing seat, the third laser is located below the workbench, and the laser light emitted by the third laser penetrates the workbench and is irradiated onto the circuit board assembly on the workbench. Surfaces on both sides of the circuit board assembly are simultaneously heated by using the laser above the pressing plate assembly and the third laser below the workbench. This can improve heating efficiency of the circuit board assembly, increase a soldering speed of the circuit board assembly, and improve soldering efficiency of the soldering apparatus.

In a possible implementation, a heater is provided in the workbench.

With the heater provided in the workbench of each bearing seat, the heater cooperates with the laser on the pressing plate assembly to simultaneously heat both sides of the circuit board assembly. This increases heating efficiency and a soldering speed of the circuit board assembly and improves soldering efficiency of the soldering apparatus.

According to another aspect, this application provides a circuit board assembly soldering method, applied to the foregoing circuit board assembly soldering apparatus, including:

placing first circuit boards on workbenches of bearing seats in a one-to-one correspondence, where to-be-soldered surfaces of the first circuit boards face a pressing plate assembly;

stacking second circuit boards on the first circuit boards on the workbenches in a one-to-one correspondence, where to-be-soldered surfaces of the second circuit boards face the first circuit boards;

pressing the pressing plate assembly on the second circuit boards on the workbenches;

adjusting a spacing between a workbench of each adjustable bearing seat and a base plate, so that a bearing pressure on each workbench is within a preset pressure range; and connecting the second circuit boards to the first circuit boards by soldering.

According to the circuit board assembly soldering method provided in this application, the first circuit boards are respectively placed on the bearing seats, and the second circuit boards are attached to the first circuit boards on the workbenches. Then, the pressing plate assembly is pressed on the second circuit boards on the workbenches, to pre-press the circuit board assemblies and position the pressing plate assembly. Subsequently, based on a pressure value on the workbench of each adjustable bearing seat, a height of the workbench of each adjustable bearing seat is adjusted, and a spacing between the workbench of each adjustable bearing seat and the pressing plate assembly is adjusted, until a bearing pressure on the workbench of each adjustable bearing seat is within the preset pressure range. After a soldering pressure requirement of the circuit board assemblies is met, the height of the workbench of each adjustable bearing seat is fixed, to solder the first circuit boards to the second circuit boards.

In a possible implementation, each of the bearing seats is the adjustable bearing seat; and the pressing the pressing plate assembly on the second circuit boards on the workbenches, and adjusting a spacing between a workbench of each adjustable bearing seat and a base plate, so that a bearing pressure on each workbench is within a preset pressure range specifically includes:

pressing the pressing plate assembly on each of the second circuit boards, so that a bearing pressure on at least one workbench is within the preset pressure range, and a bearing pressure on the rest of the workbenches is less than a minimum pressure value within the preset pressure range, or so that bearing pressures on all the workbenches are less than a minimum pressure value within the preset pressure range; and increasing a spacing between the base plate and the workbench whose bearing pressure is less than the minimum pressure value within the preset pressure range, so that the bearing pressures on all the workbenches are within the preset pressure range.

In a possible implementation, the bearing seats include one fixed bearing seat; and the pressing the pressing plate assembly on the second circuit boards on the workbenches, and adjusting a spacing between a workbench of each adjustable bearing seat and a base plate, so that a bearing pressure on each workbench is within a preset pressure range specifically includes:

pressing the pressing plate assembly on each of the second circuit boards, so that a bearing pressure on the workbench of the fixed bearing seat is within the preset pressure range, and a bearing pressure on the workbench of each adjustable bearing seat is less than a minimum pressure value within the preset pressure range; and increasing the spacing between the workbench of each adjustable bearing seat and the base plate, so that the bearing pressure on the workbench of each adjustable bearing seat is within the preset pressure range.

In a possible implementation, one of the first circuit board and the second circuit board is a printed circuit board, and the other is a flexible circuit board.

DESCRIPTION OF REFERENCE NUMERALS

1: soldering apparatus; 2: electronic device; and 3: soldering apparatus;

11: base plate; 12: pressing plate assembly; 13: bearing seat; 13a: adjustable bearing seat; 13b: fixed bearing seat; 14: pressure sensor; 15: laser 15a: first laser; 15b: second laser; and 15c: third laser;

121: substrate; 122: separate plate; 131: workbench; 132: support frame; 151: laser body; and 152: laser glass;

1311: heater; 1321: support column; and 1322: elastic part;

21: circuit board assembly; 21a: first circuit board; 21b: second circuit board; 22: screen assembly; 23: middle frame; and 24: rear cover;

211: PCB; and 212: FPC;

211a: soldering region; 2111: component; 2112: metal conducting wire; 2113: pad; 2114: solder paste; 2121: substrate; 2121a: through hole; 2122: solder pin; and 2123: metal trace;

31: base plate; 32: pressing plate; 33: bearing seat; and 34: laser; and

331: workbench; and 332: support column.

DESCRIPTION OF EMBODIMENTS

Terms used in implementations of this application are only used to explain specific embodiments of this application, and are not intended to limit this application.

An electronic device such as a handheld wireless communication device, a desktop computer, a laptop (laptop) computer, a tablet (Tablet) computer, an ultra-mobile personal computer (ultra-mobile personal computer, UMPC), a handheld computer, a walkie-talkie, a netbook, a POS machine, or a personal digital assistant (personal digital assistant, PDA) usually has a plurality of parts. Some parts need to be electrically connected to implement functions of the corresponding parts.

Figure 1:
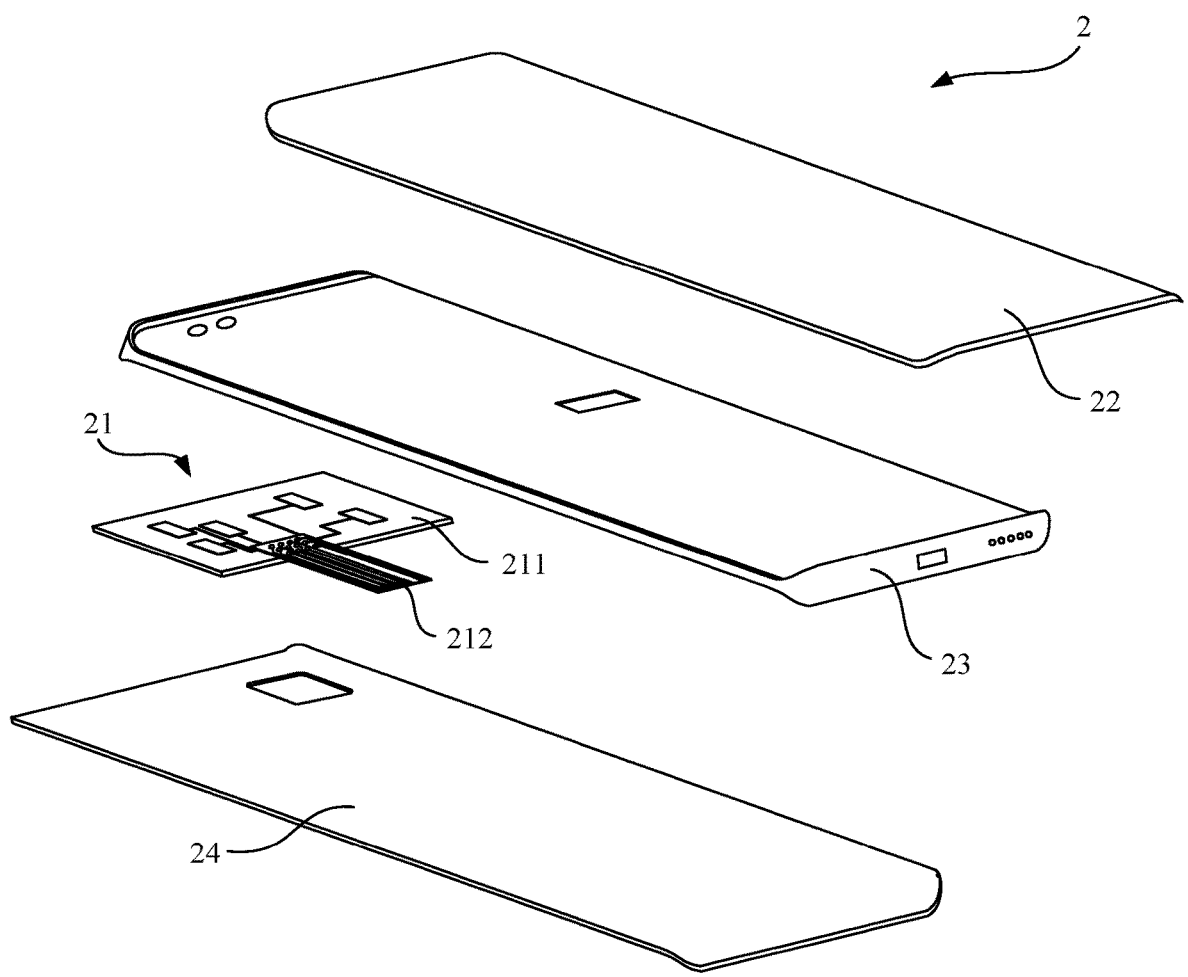
FIG. 1 is a schematic diagram of a breakdown structure of an electronic device according to an embodiment of this application.

In the embodiments of this application, an example in which the electronic device is a handheld wireless communication device is used for description. FIG. 1 is a schematic diagram of a breakdown structure of an electronic device according to an embodiment of this application. As shown in FIG. 1, for example, an electronic device 2 is specifically a mobile phone. The electronic device 2 usually includes a screen assembly 22, a middle frame 23, a circuit board assembly 21, and a rear cover 24. The screen assembly 22 has a display region for displaying image information (not shown in the figure). The middle frame 23 is provided between the screen assembly 22 and the rear cover 24 in a thickness direction of the electronic device 2. The screen assembly 22, the middle frame 23, and the rear case 24 together enclose an accommodating space. The circuit board assembly 21 is provided in the accommodating space.

The circuit board assembly 21 includes a printed circuit board (Printed Circuit Board, PCB) and a flexible printed circuit (Flexible Printed Circuit, FPC).

Figure 2:
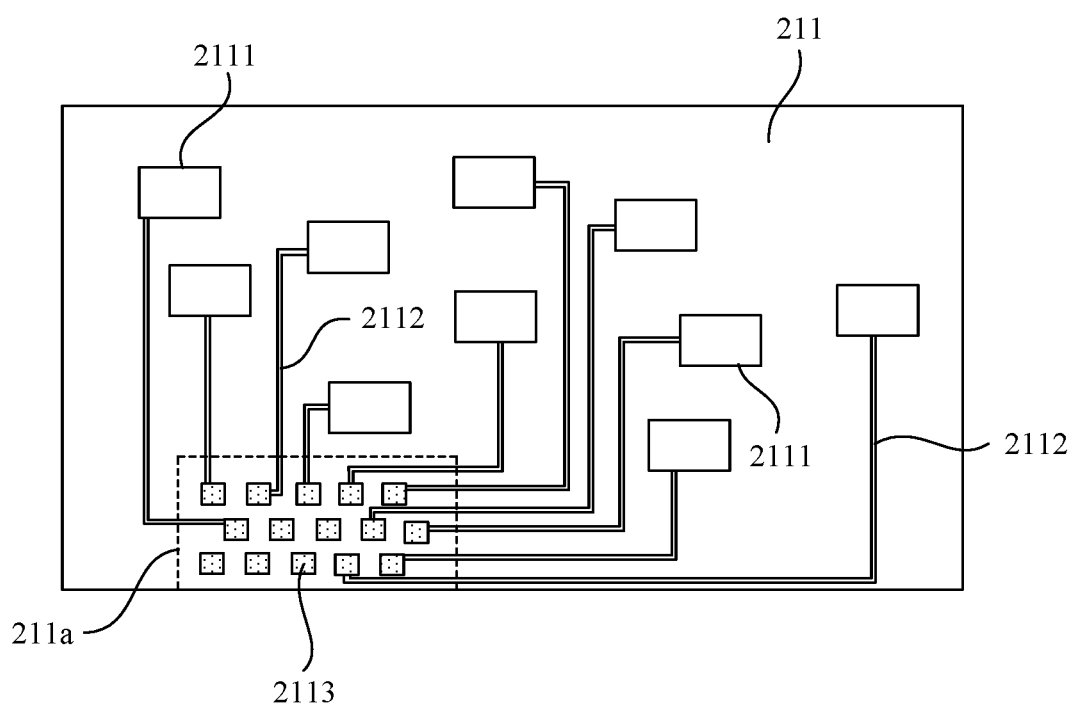
FIG. 2 is a schematic diagram of a structure of a PCB according to an embodiment of this application.

FIG. 2 is a schematic diagram of a structure of a PCB according to an embodiment of this application. As shown in FIG. 2, a PCB 211 may be a single-sided board or a double-sided board. "Single-sided board" means that components 2111 are provided on a board surface on one side of the PCB 211. "Double-sided board" means that components 2111 are provided on board surfaces on both sides of the PCB 211. The PCB 211 may be a radio frequency (Radio Frequency, RF) board or an application processor (Application Processor, AP) board. The radio frequency board may be configured to bear a radio frequency integrated circuit (radio frequency integrated circuit, RFIC), a radio frequency power amplifier (radio frequency power amplifier, RFPA), a wireless fidelity (wireless fidelity, Wi-Fi) chip, and the like, but is not limited thereto. The application processor board may be configured to bear a system on chip (system on chip, SOC) element, a double data rate (double data rate, DDR) memory, a primary power management unit (power management unit, PMU), a secondary power management unit, and the like, but is not limited thereto.

For example, the PCB 211 is a mainboard in the electronic device 2. The components 2111 provided on the PCB 211 may include but are not limited to a processor, an antenna module, a Bluetooth module, a Wi-Fi module, a global positioning system (Global Positioning System, GPS) module, a power supply and charging module, a graphics processing module, a screen display and operation module, and the like.

An FPC 212 is configured to electrically connect some functional parts of the electronic device 2 to corresponding components 2111 on the PCB 211. For example, through the FPC 212, the screen assembly 22 is electrically connected to the screen display and operation module provided on the PCB 211, and a camera module (not shown in the figure) is electrically connected to the graphics processing module provided on the PCB 211.

In practical application, the FPC 212 may be connected to the PCB 211 through a board to board (board to board, BTB) connector. However, the BTB connector has a large volume and occupies a large space. Therefore, the BTB connector is not conducive to layout of the components 2111 in the electronic device 2 and not conducive to reduction of an overall thickness of the electronic device 2, and cannot meet a lightening and thinning development trend of the electronic device 2.

Figure 3:
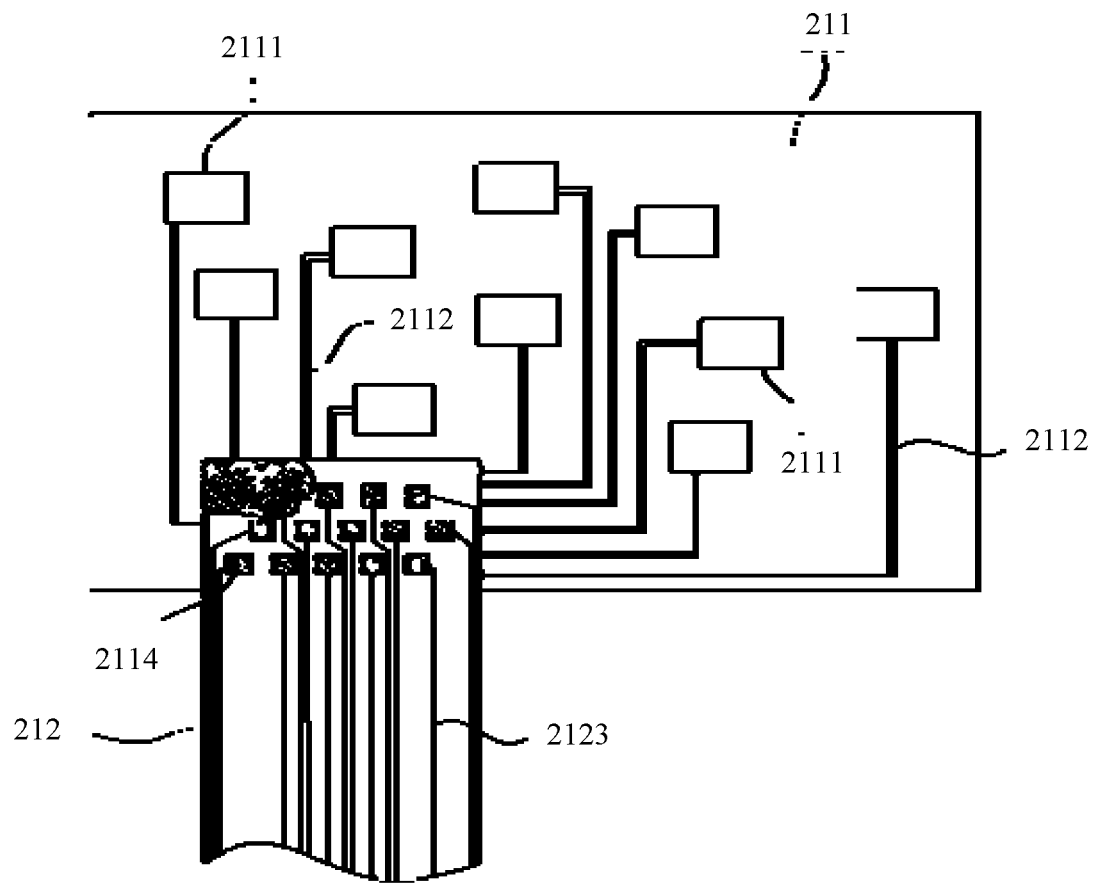
FIG. 3 is a schematic diagram of a structure of a circuit board assembly according to an embodiment of this application.

FIG. 3 is a schematic diagram of a structure of a circuit board assembly according to an embodiment of this application. As shown in FIG. 3, to avoid connecting the FPC 212 to the PCB 211 by using a BTB connector, currently, an FPC on board (FPC 212 on board, FOB) technology is usually used to implement soldered connection between the FPC 212 and the PCB 211, so that the FPC 212 is attached to the PCB 211. A thickness of a soldering seam between the FPC 212 and the PCB 211 is relatively small. This can reduce an overall thickness of the circuit board assembly 21, and reduce a space occupied by the circuit board assembly 21 to make the layout of the components 2111 in the electronic device 2 reasonable, and reduce the overall thickness of the electronic device 2.

As shown in FIG. 2, a soldering region 211a is provided on the PCB 211, and the FPC 212 is soldered in the soldering region 211a on the PCB 211. A plurality of pads 2113 are provided in the soldering region 211a of the PCB 211, and a plurality of metal conducting wires 2112 are further arranged on the PCB 211. The pads 2113 and the components 2111 are electrically connected by using the metal conducting wires 2112. For example, a material for forming the pads 2113 and the metal conducting wires 2112 may be but is not limited to copper or a copper alloy.

Figure 4:
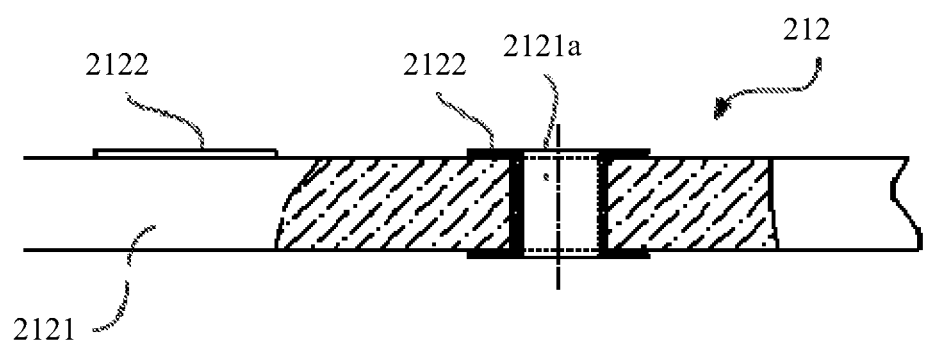
FIG. 4 is a diagram of a partial cross-sectional structure of an FPC according to an embodiment of this application.

FIG. 4 is a diagram of a partial cross-sectional structure of an FPC according to an embodiment of this application. As shown in FIG. 4, the FPC 212 includes a substrate 2121. The substrate 2121 is a flexible dielectric layer. The flexible dielectric layer has good flexibility, so that the FPC 212 can be bent when subjected to an external force. A plurality of solder pins 2122 and a plurality of metal traces 2123 are arranged on the substrate 2121. The metal traces 2123 are respectively connected to the solder pins 2122, and the solder pins 2122 on the FPC 212 are configured to implement soldered connection to the pads 2113 on the PCB 211, to implement mutual conduction between the FPC 212 and the PCB 211. For ease of connection between the FPC 212 and the PCB 211, usually, the solder pins 2122 on the FPC 212 are provided in a centralized manner in a region of the FPC 212 that is close to an end.

For example, a material for forming the flexible dielectric layer of the substrate 2121 of the FPC 212 includes but is not limited to polyimide (Polyimide, PI), thermoplastic polyimide (Thermoplastic polyimide, TPI), or polyethylene terephthalate (Polyethylene terephthalate, PET). A material for forming the solder pins 2122 and the metal traces 2123 on the FPC 212 may be but is not limited to copper or a copper alloy.

Specifically, through holes 2121a are provided on the substrate 2121 of the FPC 212. The through holes 2121a run through both side surfaces of the substrate 2121 in a thickness direction. A material such as copper or a copper alloy is attached to inner walls of the through holes 2121a to form the solder pins 2122 of the FPC 212. In addition, the solder pins 2122 extend from the inside of the through holes 2121a to both side surfaces of the substrate 2121 that cover peripheries of the through holes 2121a.

Figure 5:
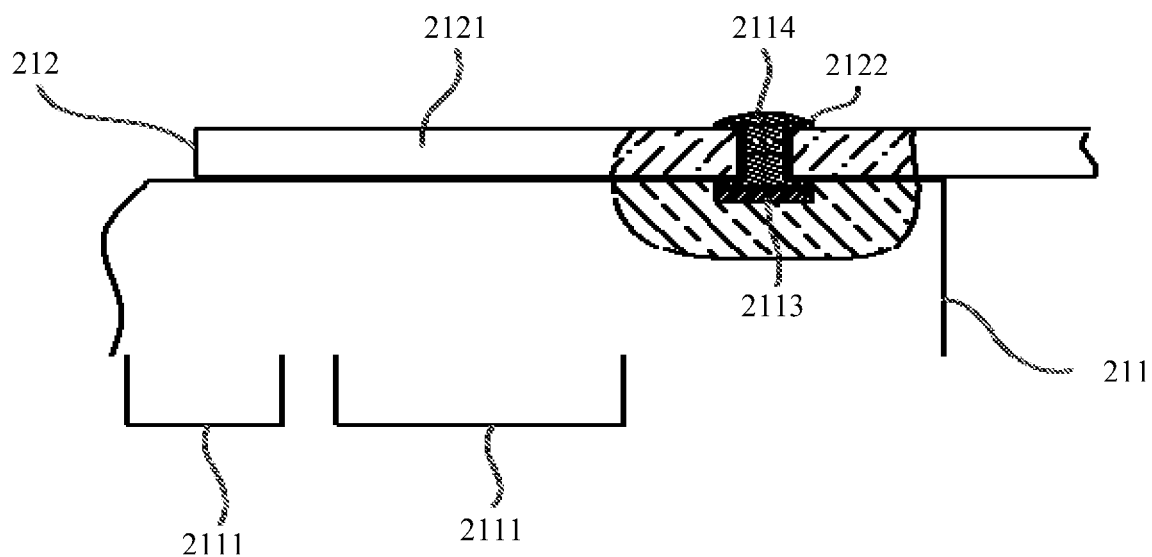
FIG. 5 is a diagram of a partial cross-sectional structure of soldered connection between an FPC and a PCB according to an embodiment of this application.

FIG. 5 is a diagram of a partial cross-sectional structure of soldered connection between an FPC and a PCB according to an embodiment of this application. As shown in FIG. 5, in practical application, solder paste 2114 may be pre-printed on the pads 2113 of the PCB 211 before the FPC 212 is soldered to the PCB 211. For example, the solder paste 2114 may include tin and a solder flux. The FPC 212 may be attached to a side surface of the PCB 211 that is provided with the pads 2113, and the solder pins 2122 on the FPC 212 are aligned with the pads 2113 on the PCB 211 and then brought into contact with the solder paste 2114 on the pads 2113. A compressive stress may be applied to a surface of one of the FPC 212 or the PCB 211 that faces away from the other, and the solder paste 2114 on the pads 2113 of the PCB 211 may be heated and melted. In this way, the molten solder paste 2114 flows along the through holes 2121a of the FPC 212 under the pressing action on the FPC 212 and overflows from the other side of the FPC 212. After the solder paste 2114 overflows and is cured, a fixed connection between the FPC 212 and the PCB 211 is implemented. The FPC 212 is electrically connected to the PCB 211 through the solder pins 2122 and the solder paste 2114 in the through holes 2121a.

In addition, as the solder flux contained in the solder paste 2114 is volatile, an additional layer of solder flux may be further coated on the solder paste 2114 before the PCB 211 is soldered to the FPC 212, to remove an oxide on a surface of the solder paste 2114 and improve performance of soldering between the PCB 211 and the FPC 212.

Figure 6:
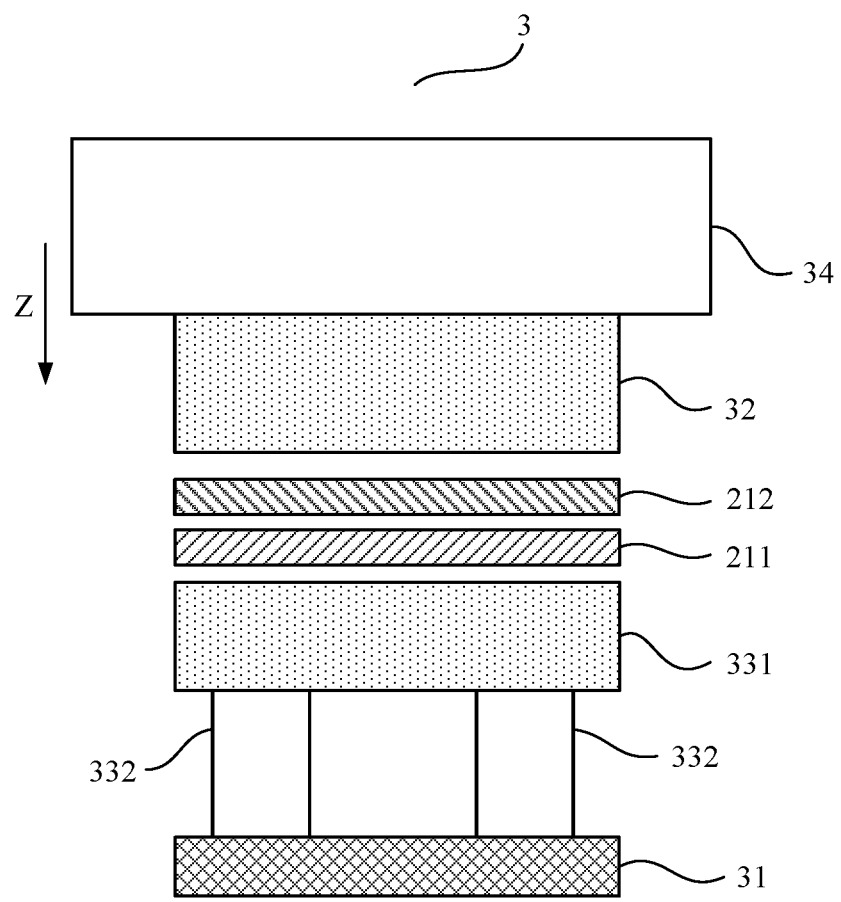
FIG. 6 shows a circuit board assembly soldering apparatus in a related technology.

The soldered connection between the PCB 211 and the FPC 212 is completed on a soldering apparatus. FIG. 6 shows a circuit board assembly soldering apparatus in a related technology. As shown in FIG. 6, the circuit board assembly soldering apparatus (referred to as soldering apparatus 3 for short below) includes a base plate 31, a pressing plate 32 located above the base plate 31, a laser 34 mounted above the pressing plate 32, and bearing seats 33 mounted on the base plate 31. The bearing seats 33 each include a support column 332 and a workbench 331. A bottom end of the support column 332 is supported on the base plate 31, the workbench 331 is located at a top end of the support column 332, and the workbench 331 faces the pressing plate 32.

During soldering, the PCB 211 is first placed on the workbench 331, so that a to-be-soldered surface of the PCB 211 faces upward towards the pressing plate 32, that is, a side surface of the PCB 211 that is provided with the soldering region 211a faces upward towards the pressing plate 32. After the PCB 211 is properly placed, a layer of solder flux may be coated on the surface of the solder paste 2114 on the pads 2113 in the soldering region 211a of the PCB 211, and then the FPC 212 may be stacked on the PCB 211.

Figure 7:
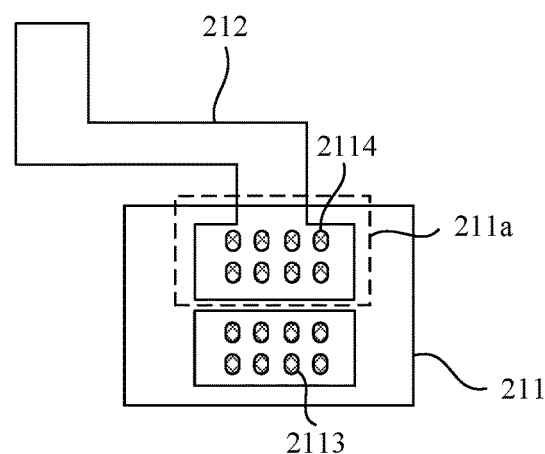
FIG. 7 is a schematic diagram of a soldering status of a circuit board assembly in a related technology.

FIG. 7 is a schematic diagram of a soldering status of a circuit board assembly in a related technology. As shown in FIG. 7, when the FPC 212 is placed, the region provided with the solder pins 2122 at the end of the FPC 212 corresponds to the soldering region 211a of the PCB 211, and the solder pins 2122 on the FPC 212 are aligned with the pads 2113 on the PCB 211. After the FPC 212 is properly placed, the pressing plate 32 is moved downward in a Z direction to be pressed on the FPC 212 placed on the workbench 331. Laser light emitted by the laser 34 heats the FPC 212, so that the solder paste 2114 on the pads 2113 of the PCB 211 is melted and overflows to the side surface of the FPC 212 that faces away from the PCB 211, to solder and fasten the FPC 212 to the PCB 211.

Different FPCs 212 have different thicknesses in a processing and manufacturing process. If the soldering apparatus 3 shown in FIG. 6 is used to simultaneously solder two FPCs 212 on two PCBs 211 respectively, two circuit board assemblies 21 are both placed on the workbenches 331, and the pressing plate 32 is pressed on the FPCs 212 in the two circuit board assemblies 21 at the same time. Because the two FPCs 212 have different thicknesses, the two FPCs 212 are subjected to different pressures, and have different soldering statuses. As a result, at least one circuit board assembly 21 cannot be normally used or may even be damaged.

For example, the solder paste 2114 on the PCB 211 in one of the circuit board assemblies 21 does not run through both sides of the FPC 212, and consequently, the circuit board assembly 21 is insecurely soldered, and the circuit board assembly 21 cannot meet a use requirement. Alternatively, the solder paste 2114 on the PCBs 211 in both circuit board assemblies 21 runs through both sides of the FPCs 212, but one of the circuit board assemblies 21 is subjected to an excessively large pressure. As a result, the metal traces 2123 on the FPC 212 or the metal conducting wires 2112 on the PCB 211 are pressed to break, and even a board body of the PCB 211 or the substrate 2121 of the FPC 212 is cracked, causing damage to the circuit board assembly 21.

Therefore, when the soldering apparatus 3 shown in FIG. 6 is used to solder the PCB 211 to the FPC 212, a single time of soldering can usually implement soldered connection between one PCB 211 and one FPC 212, and soldering efficiency is low.

In view of this, an embodiment of this application provides a circuit board assembly soldering apparatus. In the circuit board assembly soldering apparatus provided in this embodiment of this application, at least two bearing seats are provided, and the bearing seats include at least one adjustable bearing seat. A height of the adjustable bearing seat is adjustable, so that soldering requirements of different circuit board assemblies can be met. The soldering apparatus can implement soldered connection of at least two circuit board assemblies at a single time of soldering, and can improve soldering efficiency of circuit board assemblies.

The following describes in detail the circuit board assembly soldering apparatus provided in this embodiment of this application.

Embodiment 1

Figure 8:
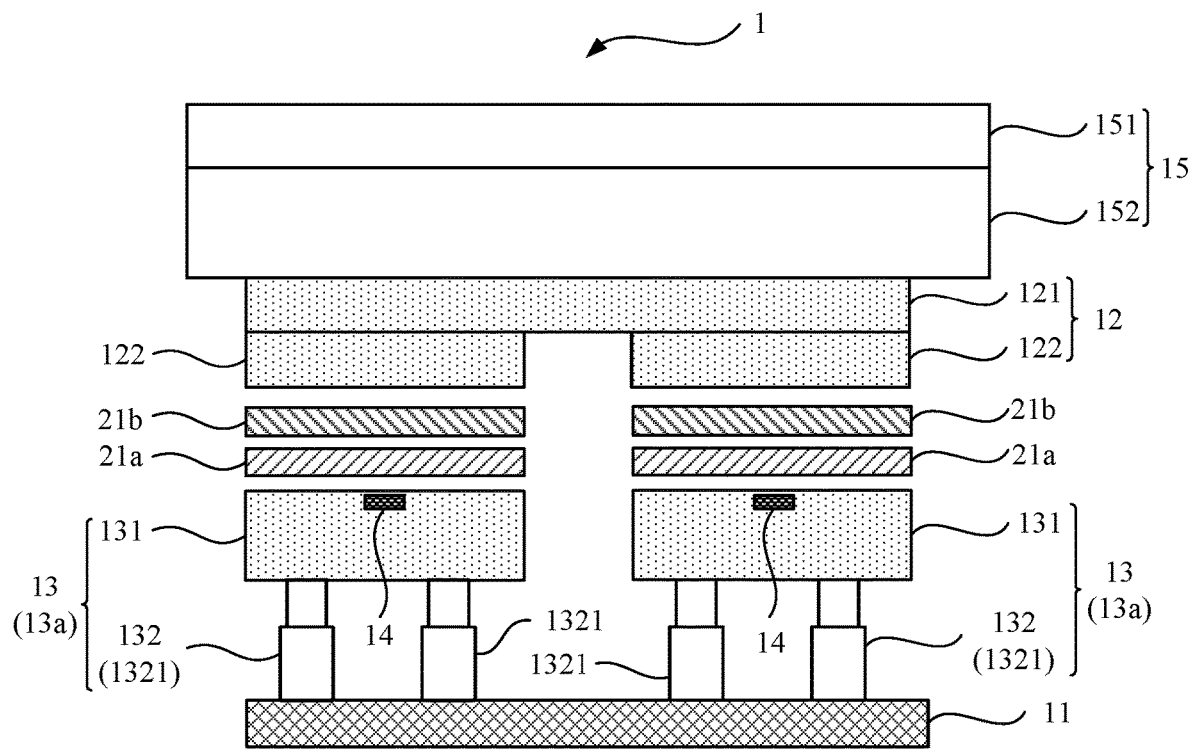
FIG. 8 is a schematic diagram of a structure of a circuit board assembly soldering apparatus according to Embodiment 1 of this application.

FIG. 8 is a schematic diagram of a structure of a circuit board assembly soldering apparatus according to Embodiment 1 of this application. As shown in FIG. 8, the circuit board assembly soldering apparatus (referred to as soldering apparatus 1 for short below) provided in this embodiment includes a base plate 11, a pressing plate assembly 12, and bearing seats 13. The pressing plate assembly 12 is oppositely provided above the base plate 11. In practical application, the pressing plate assembly 12 and the base plate 11 are provided opposite to each other in a vertical space, for example, the base plate 11 may be located on a ground, while the pressing plate assembly 12 is located above the base plate 11 in the vertical direction. Each bearing seat 13 is mounted on the base plate 11, and the bearing seat 13 is located in a space between the pressing plate assembly 12 and the base plate 11.

The bearing seat 13 includes a support frame 132 and a workbench 131. The support frame 132 is supported on the base plate 11. The workbench 131 is mounted on the support frame 132, and the workbench 131 is located on a side of the support frame 132 that faces the pressing plate assembly 12. For example, one end of the support frame 132 that is connected to the base plate 11 is a bottom end of the support frame 132, and the other end opposite to the bottom end is a top end of the support frame 132. The workbench 131 is located at the top end of the support frame 132. A workspace is formed between the pressing plate assembly 12 and the workbench 131 of the bearing seat 13. During soldering, a circuit board assembly 21 is located in the workspace.

Specifically, during soldering, the circuit board assembly 21 is placed on the workbench 131 of the bearing seat 13, the base plate 11 assembly is pressed on the circuit board assembly 21 on the workbench 131, and the soldering apparatus 1 is used to heat the circuit board assembly 21 placed on the workbench 131, so as to heat solder paste 2114 on the circuit board assembly 21. In addition, with the pressure action of the pressing plate assembly 12 on the circuit board assembly 21, the molten solder paste 2114 is squeezed to flow. After the solder paste 2114 is cured, the circuit board assembly 21 is securely soldered.

As shown in FIG. 8, the circuit board assembly 21 includes a first circuit board 21a and a second circuit board 21b. One of the first circuit board 21a and the second circuit board 21b is a PCB 211, and the other is an FPC 212. In some application scenarios, for example, when soldered connection is required between two PCBs 211, the first circuit board 21a and the second circuit board 21b may be both PCBs 211; and when soldered connection is required between two FPCs 212, the first circuit board 21a and the second circuit board 21b may be both FPCs 212. This is not limited in this embodiment. The following provides descriptions all by using an example in which one of the first circuit board 21a and the second circuit board 21b is a PCB 211, and the other is an FPC 212.

During soldering, the first circuit board 21a is first placed on the workbench 131. The workbench 131 is generally provided with a positioning region (not shown in the figure). The first circuit board 21a is placed in the positioning region on the workbench 131. For example, an identification and alignment module (not shown in the figure) may be provided on the soldering apparatus 1, and the identification and alignment module is configured to determine whether the first circuit board 21a is accurately positioned, to ensure soldering performance of the circuit board assembly 21.

After the first circuit board 21a is properly placed, the second circuit board 21b is stacked on the first circuit board 21a, to ensure accurate alignment of the second circuit board 21b with the first circuit board 21a. Then, the pressing plate assembly 12 is pressed downward on the second circuit board 21b, to generate a pressure on the second circuit board 21b and the first circuit board 21a. At the same time, the soldering apparatus 1 heats the first circuit board 21a and the second circuit board 21b, so that the solder paste 2114 on pads 2113 of the PCB 211 is melted. In addition, the molten solder paste 2114 is squeezed and flows along through holes 2121a on the FPC 212, and overflows from a side of the FPC 212 that faces away from the PCB 211. After the solder paste 2114 is cured, the soldered connection between the FPC 212 and the PCB 211 is implemented.

For the soldering apparatus 1 to solder at least two circuit board assemblies 21 at a single time, as shown in FIG. 8, in this embodiment, at least two bearing seats 13 are mounted on the base plate 11 of the soldering apparatus 1. One circuit board assembly 21 can be placed on the workbench 131 of each bearing seat 13, so that soldered connection can be simultaneously implemented for at least two circuit board assemblies 21.

Figure 9:
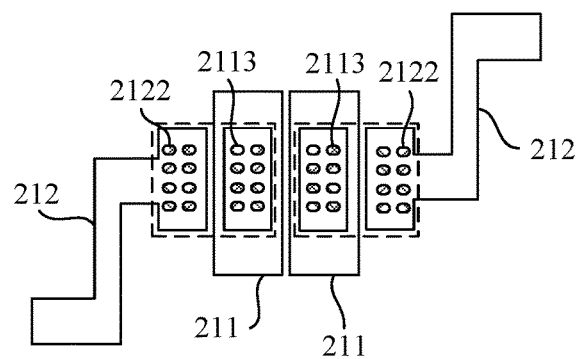
FIG. 9 is a schematic diagram of soldering alignment of two circuit board assemblies according to Embodiment 1 of this application.

FIG. 9 is a schematic diagram of soldering alignment of two circuit board assemblies according to Embodiment 1 of this application. As shown in FIG. 9, two bearing seats 13 arranged side by side are used as an example. In addition, for example, the first circuit board 21a first placed on the workbench 131 of the bearing seat 13 is the PCB 211, and the second circuit board 21b stacked on the first circuit board 21*a* is the FPC 212. The PCBs 211 on the two bearing seats 13 are placed side by side. The two FPCs 212 may be placed onto the two PCBs 211 respectively from sides of the two PCBs 211 that are away from the other PCB 211, that is, the two FPCs 212 may be placed onto the respective workbenches 131 from sides of the two bearing seats 13 that are away from the other bearing seat 13. In this way, interference between the two FPCs 212 is avoided. For example, one ends of the two FPCs 212 that are each provided with solder pins 2122 in a centralized manner are close to each other, and the other ends of the two FPCs 212 are away from each other. When the FPC 212 is aligned with the PCB 211, the solder pins 2122 on the FPC 212 are aligned with the pads 2113 on the PCB 211.

In addition to the case in FIG. 9 in which two FPCs 212 are respectively connected to two PCBs 211, in practice, there is also a case in which at least two FPCs 212 are connected to different soldering regions 211*a* on a same PCB 211. For this, in this embodiment, one PCB 211 may be placed in a whole workspace formed between the pressing plate assembly 12 and each bearing seat 13, and different FPCs 212 may be placed on workbenches 131 of different adjustable bearing seats 13*a*, so as to solder the different FPCs 212 to the same PCB 211.

It should be noted that, as it is required to adjust heights of the workbenches 131 of the adjustable bearing seats 13*a*, the FPCs 212 may be first placed on the workbenches 131, and then the PCB 211 is stacked on the FPCs 212, so that the PCB 211 is positioned on a side of the pressing plate assembly 12. For FPCs 212 with different thicknesses, the FPCs 212 can be moved by moving the workbenches 131, so as to adjust an attachment pressure between the FPCs 212 and the PCB 211 to avoid damage to the PCB 211 when the workbenches 131 are moved.

In addition, for the case in which different FPCs 212 are soldered to a same PCB 211, each adjustable bearing seat 13*a* may be movably mounted on the base plate 11, so as to adjust a spacing between the adjustable bearing seats 13*a* based on a spacing between soldering regions 211*a* on the PCB 211. In this way, the workbenches 131 of the adjustable bearing seats 13*a* are in a one-to-one correspondence with the soldering regions 211*a* on the PCB 211, so that each FPC 212 on each workbench 131 is correspondingly soldered to each soldering region 211*a* on the PCB 211.

Still referring to FIG. 8, as an implementation, all of the bearing seats 13 mounted on the base plate 11 are adjustable bearing seats 13*a*, and support frames 132 of the adjustable bearing seats 13*a* can adjust heights of the workbenches 131 relative to the base plate 11. As described above, due to the limitation by the processing and manufacturing process, thicknesses of FPCs 212 cannot be kept completely consistent, and there is usually a thickness difference between different FPCs 212. Therefore, the adjustable bearing seats 13*a* with the adjustable workbenches 131 are provided, so as to adjust the heights of the workbenches 131 and control a spacing between the pressing plate assembly 12 and the workbenches 131 based on pressures required for soldering different circuit board assemblies 21, thereby ensuring the pressures borne by the circuit board assemblies 21 are within a proper range.

It should be noted that, the pressure borne by the circuit board assembly 21 needs to be capable of squeezing the molten solder paste 2114 on the PCB 211 to overflow from the side of the FPC 212 that faces away from the PCB 211, thereby ensuring that the FPC 212 is securely soldered to the PCB 211. In addition, an excessively large pressure is not suitable for the circuit board assembly 21, so as to avoid damage to the structure of the FPC 212 or the PCB 211.

In practical application, after the circuit board assemblies 21 are respectively placed on the workbenches 131 of the adjustable bearing seats 13*a*, the pressing plate assembly 12 is moved downward by a particular distance. For example, the pressing plate assembly 12 is moved near the second circuit boards 21*b* of the circuit board assemblies 21, but there is a particular gap between the pressing plate assembly 12 and all the second circuit boards 21*b*. Then, the heights of the workbenches 131 of the adjustable bearing seats 13*a* are adjusted, so that the workbenches 131 are raised and moved towards the pressing plate assembly 12, to gradually increase pressures applied by the pressing plate assembly 12 and the workbenches 131 to the circuit board assemblies 21, until the pressure borne by each circuit board assembly 21 is within the proper range, and then the heights of the workbenches 131 of the adjustable bearing seats 13*a* are fixed to perform soldering operations of the circuit board assemblies 21.

For example, initial heights of the workbenches 131 of the adjustable bearing seats 13*a* may be kept the same, that is, spacings between the workbenches 131 of the adjustable bearing seats 13*a* and the base plate 11 are equal. After the circuit board assemblies 21 are placed on the workbenches 131, the pressing plate assembly 12 is moved downward by a particular distance. In this case, a spacing between the pressing plate assembly 12 and a circuit board assembly 21 with a largest thickness in the circuit board assemblies 21 is smallest. The circuit board assembly 21 with the largest thickness is, for example, a circuit board assembly 21 whose FPC 212 has a largest thickness. Afterwards, the workbenches 131 of the adjustable bearing seats 13*a* are raised, until the pressure borne by each circuit board assembly 21 is within the proper range.

It can be understood that, after the pressing plate assembly 12 is moved downward and positioned, it is possible that a pressure borne by the circuit board assembly 21 with the largest thickness is within the proper range, while a pressure borne by a remaining circuit board assembly 21 is less than a required pressure. The pressure borne by the remaining circuit board assembly 21 may be made within the proper range by raising the height of the workbench 131 on which the remaining circuit board assembly 21 is located.

In another implementation, alternatively, the pressing plate assembly 12 may be a fixed pressing plate assembly 12, or the pressing plate assembly 12 may be a liftable pressing plate assembly 12 with a fixed location. The circuit board assemblies 21 can be respectively pressed between the workbenches 131 and the pressing plate assembly 12 by raising the heights of the workbenches 131 of the adjustable bearing seats 13*a*.

As shown in FIG. 8, the support frame 132 of the adjustable bearing seat 13*a* includes at least one support column 1321. The support column 1321 is supported on the base plate 11. One end of the support column 1321 is mounted on the base plate 11, while the workbench 131 is mounted on the other end of the support column 1321. In this embodiment, the end of the support column 1321 that is mounted on the base plate 11 is defined as a bottom end of the support column 1321, and the end of the support column 1321 that is connected to the workbench 131 is defined as atop end of the support column 1321. For example, the support column 1321 may be vertically supported on the base plate 11, and an axial direction of the support column 1321 is perpendicular to a plate surface direction of the base plate 11.

To improve stability of the workbench 131, at least two support columns 1321 may be provided between the workbench 131 and the base plate 11. For example, a cross-sectional shape of the workbench 131 is approximately rectangular. The support frame 132 may include four support columns 1321, and the support columns 1321 may be respectively provided near four corners of the workbench 131. Alternatively, the cross-sectional shape of the workbench 131 may be approximately triangular, pentagonal, hexagonal, octagonal, or the like. The support frame 132 supported between the workbench 131 and the base plate 11 may include three, five, six, eight, or another quantity of support columns 1321. The support columns 1321 may be spaced and provided close to an edge of the workbench 131.

To implement adjustment of the height of the workbench 131 by the support columns 1321 of the adjustable bearing seat 13a, as shown in FIG. 8, in an implementation, the workbench 131 of the adjustable bearing seat 13a may be fixedly connected to the top end of the support column 1321, and a height of the support column 1321 is adjustable. For example, the support column 1321 is a telescopic support column 1321, and the height of the workbench 131 of the adjustable bearing seat 13a may be changed by adjusting an extension height of the support column 1321.

For example, the support column 1321 may be a hydraulic rod. The support column 1321 includes a rod sleeve and a movable piston rod inserted within the rod sleeve, and the workbench 131 may be fixedly connected to a top end of the piston rod. By controlling a volume and a pressure of hydraulic oil entering the rod sleeve, the piston rod is enabled to move along an axial direction of the rod sleeve, and the piston rod moves to drive the workbench 131 to rise or fall. Alternatively, the support column 1321 may be another type of telescopic structure.

When the support column 1321 is a telescopic support column 1321, in some implementations, a spacing between the workbench 131 and the base plate 11 may alternatively be adjusted in an electromagnetic driving manner. For example, one of the workbench 131 and the base plate 11 is provided with a magnetic member (not shown in the figure), while the other is provided with a drive coil (not shown in the figure). A magnetic force between the magnetic member and the drive coil is changed by adjusting a size of a current flowing to the drive coil, so that the workbench 131 is driven to move by the magnetic force. For example, the workbench 131 is a magnetic member, and a drive coil may be provided in a part of the base plate 11 that is opposite to the workbench 131. When a magnetic force between the workbench 131 and the base plate 11 changes, the magnetic force drives the workbench 131 to rise or fall. The workbench 131 generates an acting force on the support column 1321, so that the support column 1321 extends or contracts.

Except the case in which the support column 1321 is a telescopic support column 1321, the workbench 131 is fixed relative to the support column 1321, and the support column 1321 extends or contracts to drive the workbench 131 to move, in another implementation, the height of the support column 1321 may be fixed, while the workbench 131 can move relative to the support column 1321, and the workbench 131 may be fixed at different parts of the support column 1321. The height of the workbench 131 relative to the base plate 11 is adjusted by moving the workbench 131 along the axial direction of the support column 1321 and fixing the workbench 131 at different parts of the support column 1321 along the axial direction.

Figure 10:
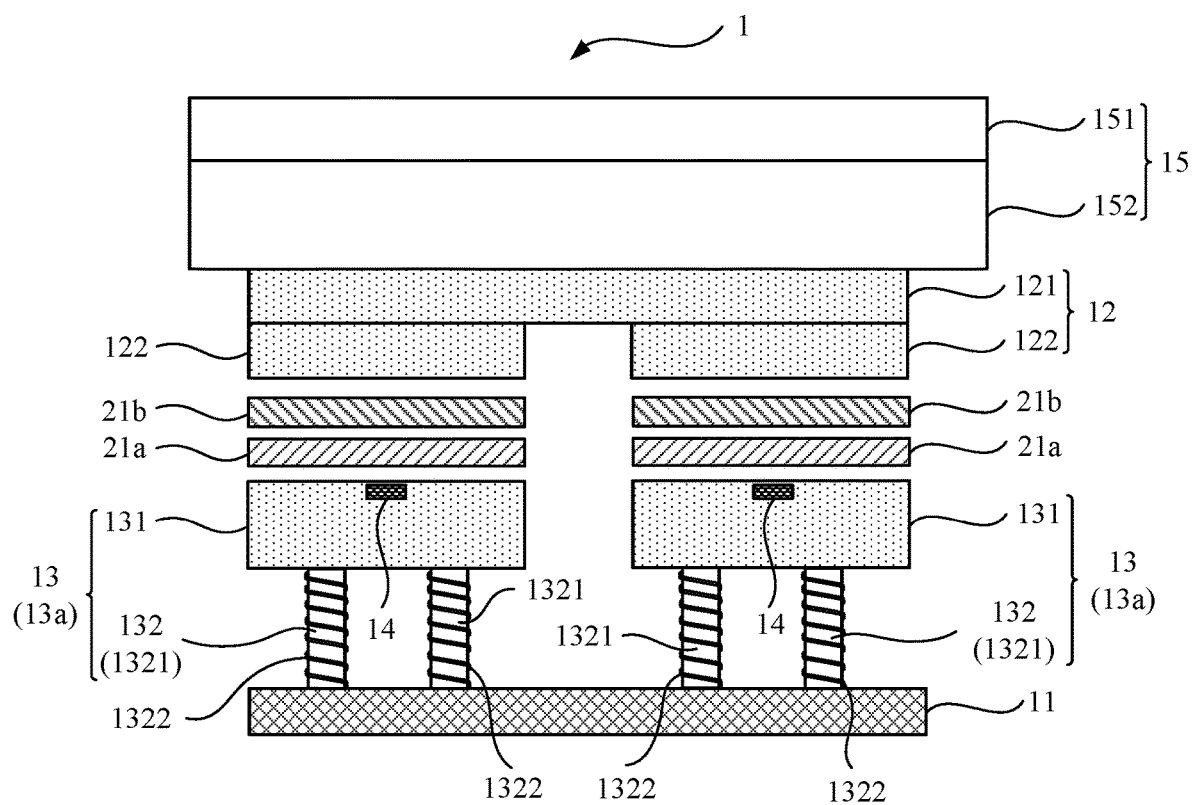
FIG. 10 is a schematic diagram of a structure of another soldering apparatus according to Embodiment 1 of this application.

FIG. 10 is a schematic diagram of a structure of another soldering apparatus according to Embodiment 1 of this application. As shown in FIG. 10, as a specific implementation, the support column 1321 of the adjustable bearing seat 13a may be inserted into the workbench 131 (not shown in the figure). In addition, a telescopic elastic part 1322 is sleeved outside the support column 1321. Both ends of the elastic part 1322 respectively abut against the workbench 131 and the base plate 11. The workbench 131 is supported on the elastic part 1322. The height of the workbench 131 is adjusted by adjusting an expansion amount of the elastic part 1322, so that the workbench 131 is located at different parts of the support column 1321. For example, the support column 1321 is a screw rod, and the elastic part 1322 is a spring sleeved outside the screw rod. The screw rod is inserted into the workbench 131, and both ends of the spring respectively abut between the base plate 11 and the workbench 131. The height of the workbench 131 is adjusted by adjusting an expansion amount of the spring.

It can be understood that, the screw rod inserted into the workbench 131 can guide the movement of the workbench 131, and the screw rod can support and limit a spring with weak rigidity. This can improve strength of the spring, improve stability of the spring in an extension and contraction process, limit telescopic movement of the spring along an axial direction of the screw rod, and ensure accuracy of the movement of the workbench 131 driven by the spring.

In a process of adjusting the height of the workbench 131 to a suitable location, the elastic part 1322 may always be in a compressed state. An elastic force generated when the elastic part 1322 is compressed applies an upward support force to the workbench 131, so that a pressure between the workbench 131 and the pressing plate assembly 12 can be increased to ensure that the workbench 131 and the pressing plate assembly 12 are tightly pressed on the circuit board assembly 21. Alternatively, the elastic part 1322 may be switched between a compressed state and an extending state. When the workbench 131 is moved in place while the elastic part 1322 is in the extending state, a limiting structure may be provided on the support column 1321 to ensure the stability of the workbench 131.

In addition, the expansion amount of the elastic part 1322 sleeved outside the support column 1321 may alternatively be adjusted in the electromagnetic driving manner described above. Still using the example in which the workbench 131 is a magnetic member and a drive coil is provided in the base plate 11, a magnetic force between the magnetic member and the drive coil is changed to drive the workbench 131 to move relative to the base plate 11, so that the workbench 131 moves to drive the elastic part 1322 to extend or contract.

Still referring to FIG. 8, a pressure sensor 14 is provided inside the workbench 131 of each adjustable bearing seat 13a. The pressure sensor 14 detects a value of the pressure borne by the circuit board assembly 21 on the workbench 131. In this way, before soldering, the height of the workbench 131 of the adjustable bearing seat 13a is adjusted to control the pressure borne by the circuit board assembly 21 within the proper range. For example, a pressure range required for soldering the circuit board assembly 21 is 5-20 N. When the pressure sensor 14 detects that the pressure borne by the circuit board assembly 21 is within 5-20 N, it indicates that the pressure borne by the circuit board assembly 21 is within a proper range, and the workbench 131 of the adjustable bearing seat 13a can be fixed at a current height location.

After the pressing plate assembly 12 is moved downward and pressed on the circuit board assembly 21, or after the height of the workbench 131 of the adjustable bearing seat 13a is increased, if the pressure sensor 14 detects that the pressure borne by the circuit board assembly 21 is less than a pressure required for soldering, for example, the pressure on the circuit board assembly 21 that is detected by the pressure sensor 14 is less than 5 N, the workbench 131 is still moved upward slowly, until a pressure detected by the pressure sensor 14 is within the proper range required for soldering.

For example, the pressure sensor 14 may be close to a work surface of the workbench 131, to be specific, the pressure sensor 14 is provided close to a surface of the workbench 131 for placing the circuit board assembly 21, to improve precision of detecting, by the pressure sensor 14, the pressure borne by the circuit board assembly 21. For example, the pressure sensor 14 may be attached to an inner wall surface of the workbench 131 that corresponds to its work surface.

In this embodiment, the circuit board assembly 21 may be heated by using energy generated by laser light emitted by a laser 15. Specifically, still referring to FIG. 8, the soldering apparatus 1 includes the laser 15. The laser 15 is provided above the pressing plate assembly 12, that is, the laser 15 is provided on a side of the pressing plate assembly 12 that faces away from the base plate 11. The laser light emitted by the laser 15 penetrates the pressing plate assembly 12 and is irradiated onto the workbench 131. The circuit board assembly 21 located on the workbench 131 is heated by the energy of the laser light, so that the solder paste 2114 on the pads 2113 of the PCB 211 is melted, thereby implementing the soldered connection between the PCB 211 and the FPC 212.

The laser 15 may include a laser body 151 and laser glass 152. The laser body 151 is configured to emit laser light, and the laser glass 152 is provided on an out-light side of the laser body 151. The laser glass 152 is configured to protect purity of the laser body 151, to avoiding impurities from entering the laser body 151. The laser light emitted by the laser body 151 penetrates the laser glass 152 and the pressing plate assembly 12 and is irradiated onto the circuit board assembly 21 on the workbench 131. For example, the laser glass 152 may be attached to a side surface of the pressing plate assembly 12 that faces away from the base plate 11.

As shown in FIG. 8, for example, the first circuit board 21a placed on the workbench 131 is the PCB 211, and the second circuit board 21b stacked on the first circuit board 21a is the FPC 212. The laser light emitted by the laser 15 penetrates the laser glass 152 and the pressing plate assembly 12 and is irradiated onto a surface of the FPC 212, and the FPC 212 is heated by the energy of the laser light and experiences a temperature rise. The temperature rise of the FPC 212 enables the heat to be transferred to the solder paste 2114 on the pads 2113 of the PCB 211, so that the solder paste 2114 is melted. The molten solder paste 2114 is squeezed and overflows upward to a surface of the FPC 212 that faces away from the PCB 211, thereby implementing the soldered connection between the FPC 212 and the PCB 211.

For example, the first circuit board 21a placed on the workbench 131 is the FPC 212, and the second circuit board 21b stacked on the first circuit board 21a is the PCB 211. The laser light emitted by the laser 15 is irradiated onto a surface of the PCB 211, and the PCB 211 is heated by the energy of the laser light and experiences a temperature rise. The temperature rise of the PCB 211 enables the heat to be transferred to the solder paste 2114 on the pads 2113 on the other surface of the PCB 211, so that the solder paste 2114 is melted. The molten solder paste 2114 is squeezed and overflows downward to a surface of the FPC 212 that faces away from the PCB 211, thereby implementing the soldered connection between the FPC 212 and the PCB 211.

Still referring to FIG. 8, in this embodiment, the pressing plate assembly 12 may include a substrate 121. The substrate 121 is provided opposite to the base plate 11, and the substrate 121 can cover an entire region occupied by all the bearing seats 13 provided on the base plate 11, that is, projections of the workbenches 131 of all the bearing seats 13 on the substrate 121 each are located within a coverage area of the substrate 121. Each circuit board assembly 21 is pressed between the substrate 121 and the workbench 131 of each bearing seat 13.

For example, the substrate 121 may be a glass substrate, and the glass substrate has a high light transmittance. For example, the glass substrate has a light transmittance of more than 99.5% for laser light, and the laser light penetrates the glass substrate and is irradiated onto each workbench 131. Alternatively, the substrate 121 may be a plastic substrate. The plastic substrate needs to have a high laser light transmittance. In addition, the plastic substrate has high strength and good thermal stability, and is capable of meeting a soldering pressure requirement of the circuit board assembly 21. The energy of the laser light does not affect the stability of the plastic substrate.

In addition, the pressing plate assembly 12 may further include at least two separate plates 122. Both separate plates 122 are provided on a side surface of the substrate 121 that faces the base plate 11, for example, both separate plates 122 are attached to a surface of the substrate 121. The separate plates 122 are in a one-to-one correspondence with the workbenches 131 of the bearing seats 13, and a workspace is formed between the separate plates 122 and the workbenches 131. During soldering of the circuit board assemblies 21, the circuit board assemblies 21 are pressed between the separate plates 122 and the workbenches 131.

By stacking the separate plates 122 on the surface of the substrate 121 that faces the base plate 11, strength of the pressing plate assembly 12 can be increased, a pressure bearing capability of the pressing plate assembly 12 can be improved, and reliability of the soldering apparatus 1 can be improved. In addition, as shown in FIG. 8, there is a spacing between adjacent separate plates 122. The spacing makes a particular avoidance space exist between adjacent bearing seats 13. The avoidance space is configured to avoid another structure on the circuit board assembly 21. For example, except the region that requires soldered connection, the components 2111 are further arranged in another region on the PCB 211 or the FPC 212. By adjusting orientations of the PCB 211 and the FPC 212, the components 2111 on the PCB 211 or the FPC 212 are located in the avoidance space between adjacent separate plates 122. Alternatively, for a case in which a connector is connected to an end of the FPC 212, the end of the FPC 212 that is provided with the connector may be located in the avoidance space.

Embodiment 2

Figure 11:
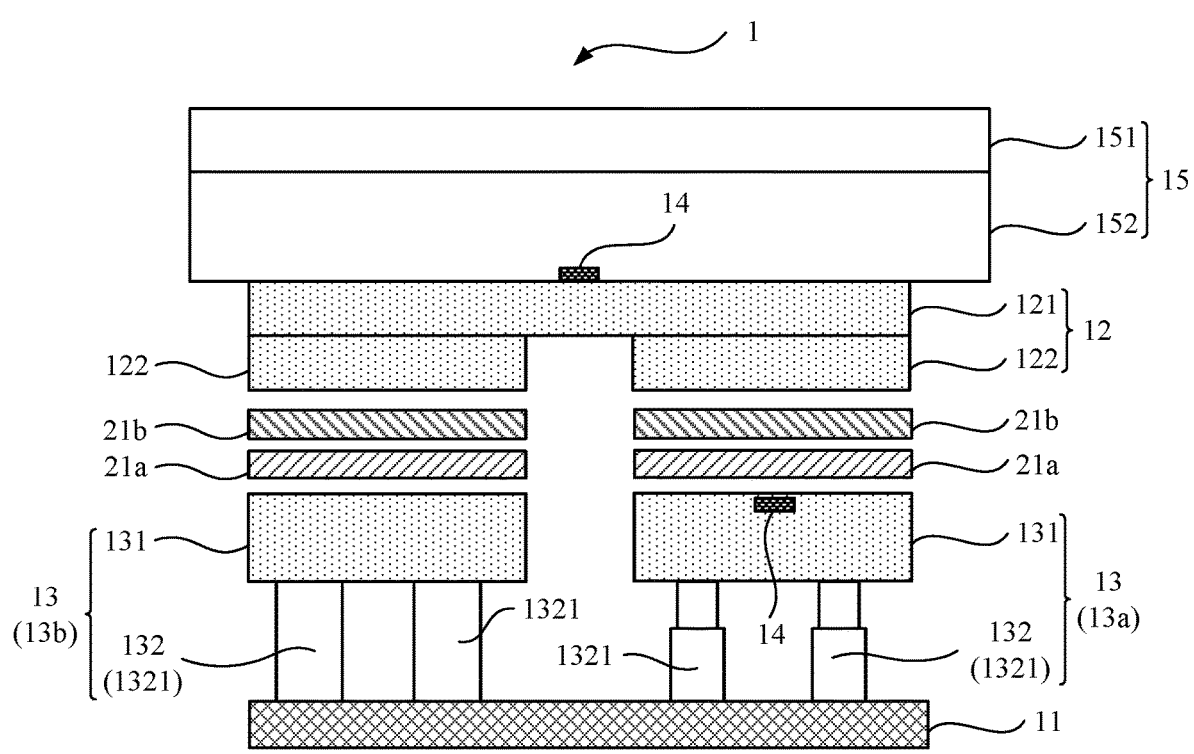
FIG. 11 is a schematic diagram of a structure of a third soldering apparatus according to Embodiment 2 of this application.

On the basis of Embodiment 1, this embodiment provides a soldering apparatus 1. FIG. 11 is a schematic diagram of a structure of a third soldering apparatus according to Embodiment 2 of this application. As shown in FIG. 11, different from the soldering apparatus 1 in Embodiment 1, the soldering apparatus 1 in this embodiment includes one fixed bearing seat 13b in the bearing seats 13, while a remaining bearing seat 13 is an adjustable bearing seat 13a. For example, the soldering apparatus 1 is provided with two bearing seats 13, where one bearing seat 13 is a fixed bearing seat 13b, and the other bearing seat 13 is an adjustable bearing seat 13a.

As shown in FIG. 11, a spacing between the workbench 131 of the fixed bearing seat 13b and the base plate 11 is fixed. For example, the support frame 132 of the fixed bearing seat 13b is a support column 1321. The support column 1321 of the fixed bearing seat 13b may be a support column 1321 whose length is unadjustable, and the workbench 131 may be fixedly mounted at a top end of the support column 1321.

It should be noted that, since a height of the workbench 131 of the fixed bearing seat 13b is unadjustable, the pressing plate assembly 12 of the soldering apparatus 1 needs to be provided as a liftable pressing plate assembly 12. Before soldering of the circuit board assembly 21, a large space is reserved between the pressing plate assembly 12 and the workbench 131 of the fixed bearing seat 13b. After the circuit board assembly 21 is placed, the pressing plate assembly 12 is moved downward, so that the pressing plate assembly 12 is pressed on a surface of the circuit board assembly 21 on the workbench 131.

When a plurality of circuit board assemblies 21 are simultaneously soldered, a height of the workbench 131 of the adjustable bearing seat 13a can be adjusted by using the fixed bearing seat 13b as reference. For example, an initial height of the workbench 131 of the adjustable bearing seat 13a may be less than the height of the workbench 131 of the fixed bearing seat 13b. In other words, before soldering operations are performed, a spacing between the workbench 131 of the adjustable bearing seat 13a and the base plate 11 is less than the spacing between the workbench 131 of the fixed bearing seat 13b and the base plate 11.

In this case, during soldering, the pressing plate assembly 12 is moved downward, and the pressing plate assembly 12 is pressed on the circuit board assembly 21 on the workbench 131 of the fixed bearing seat 13b, so that a location of the pressing plate assembly 12 is fixed after a pressure on the workbench 131 of the fixed bearing seat 13b is adjusted within a proper range. Then, the height of the workbench 131 of each adjustable bearing seat 13a is increased, so that the circuit board assembly 21 on the workbench 131 of the adjustable bearing seat 13a is pressed on the workbench 131 and the pressing plate assembly 12. When a pressure on the workbench 131 of the adjustable bearing seat 13a is within the proper range, a location of the workbench 131 of the adjustable bearing seat 13a is fixed.

With the fixed bearing seat 13b provided, when only one circuit board assembly 21 is soldered at a single time, the circuit board assembly 21 may be placed on the workbench 131 of the fixed bearing seat 13b, and only a height of the liftable pressing plate assembly 12 needs to be adjusted before soldering. Operations are simple and efficiency is high. In addition, the soldering apparatus 1 in this embodiment may be reconstructed on the basis that the original soldering apparatus 1 includes one fixed bearing seat 13b, and the adjustable bearing seat 13a may be added to the base plate 11. This facilitates implementation, without scraping the original soldering apparatus 1.

FIG. 11 shows the case in which the support frame 132 of the fixed bearing seat 13b of the soldering apparatus 1 is a support column 1321. It can be understood that, the support frame 132 of the fixed bearing seat 13b may be another structure, for example, the support frame 132 of the fixed bearing seat 13b is a frame structure. In addition, the support frame 132 of the adjustable bearing seat 13a of the soldering apparatus 1 shown in FIG. 11 is a telescopic support column 1321. In another implementation, the support frame 132 of the adjustable bearing seat 13a may alternatively be the structure shown in FIG. 10 in which the elastic part 1322 is sleeved outside the support column 1321, or the support frame 132 of the adjustable bearing seat 13a may be another structural form. Details are not described herein.

Still referring to FIG. 11, for a case with the fixed bearing seat 13b provided, one pressure sensor 14 may be provided on the pressing plate assembly 12. For example, one pressure sensor 14 may be provided on a surface of the substrate 121 of the pressing plate assembly 12 that faces away from the base plate 11. One pressure sensor 14 is provided in the workbench 131 of each adjustable bearing seat 13a.

When the pressing plate assembly 12 is pressed on the workbench 131 of each bearing seat 13, the pressure sensor 14 provided on the pressing plate assembly 12 is used to detect an average pressure on each workbench 131, and a location of the pressing plate assembly 12 is determined by using a pressure value detected by the pressure sensor 14 as reference. Then, the height of the workbench 131 of each adjustable bearing seat 13a is adjusted based on the pressure value detected by the pressure sensor 14 provided in the workbench 131 of each adjustable bearing seat 13a, so that the pressure borne by the workbench 131 of each adjustable bearing seat 13a reaches the proper range.

Figure 12:
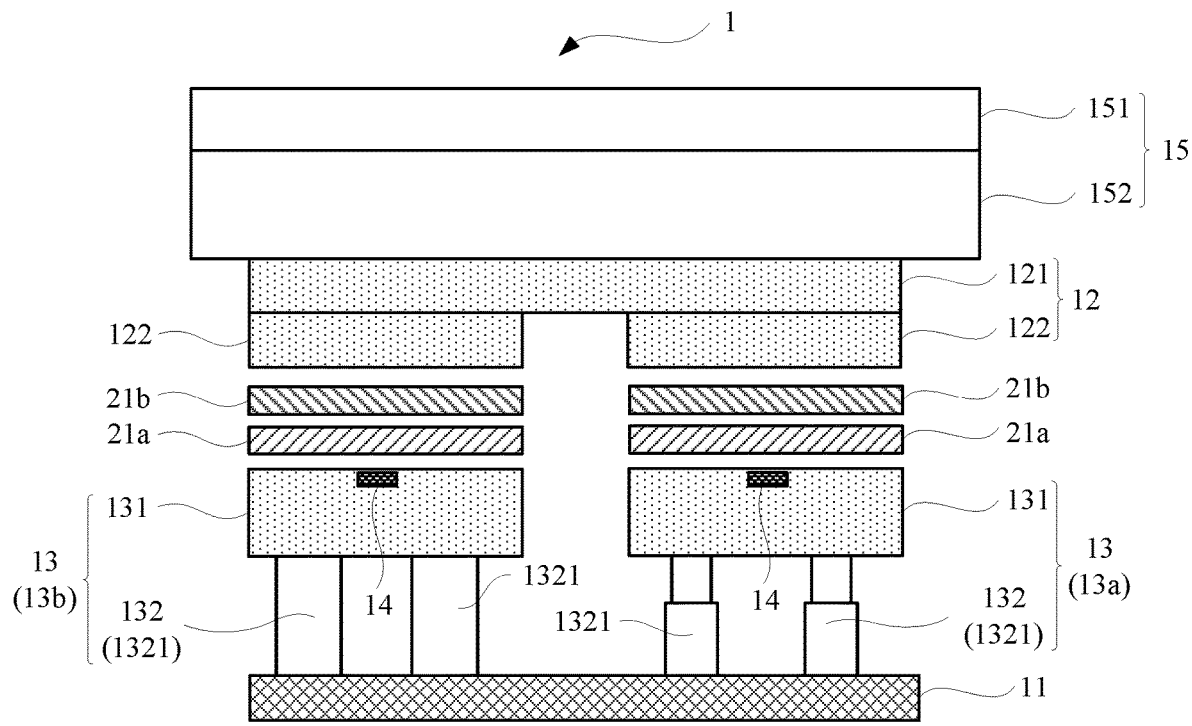
FIG. 12 is a schematic diagram of a structure of a fourth soldering apparatus according to Embodiment 2 of this application.

FIG. 12 is a schematic diagram of a structure of a fourth soldering apparatus according to Embodiment 2 of this application. As shown in FIG. 12, in another implementation, the pressure sensor 14 is not provided on the pressing plate assembly 12, but is provided in the workbench 131 of the fixed bearing seat 13b. A pressure value detected by the pressure sensor 14 in the fixed bearing seat 13b is used as reference for adjusting a height of the pressing plate assembly 12. After the pressing plate assembly 12 is moved in place, the height of the workbench 131 of each adjustable bearing seat 13a is adjusted based on a pressure value detected by the pressure sensor 14 in the workbench 131 of each adjustable bearing seat 13a.

With the pressure sensor 14 provided in the workbench 131 of the fixed bearing seat 13b, the pressure value detected by the pressure sensor 14 in the workbench 131 of the fixed bearing seat 13b is closer to a pressure borne by the workbench 131 of the fixed bearing seat 13b. Therefore, positioning precision of the pressing plate assembly 12 is higher, and the height of the workbench 131 of each adjustable bearing seat 13a can be adjusted more precisely by using the pressure value as reference. Further, soldering performance of the circuit board assembly 21 on the workbench 131 of each adjustable bearing seat 13a can be improved.

Embodiment 3

On the basis of Embodiment 1 and Embodiment 2, this embodiment improves a heating structure of the soldering apparatus 1 in Embodiment 1 and Embodiment 2, to improve efficiency of heating the circuit board assembly 21 by the soldering apparatus 1 and increase a soldering speed of the circuit board assembly 21.

Figure 13:
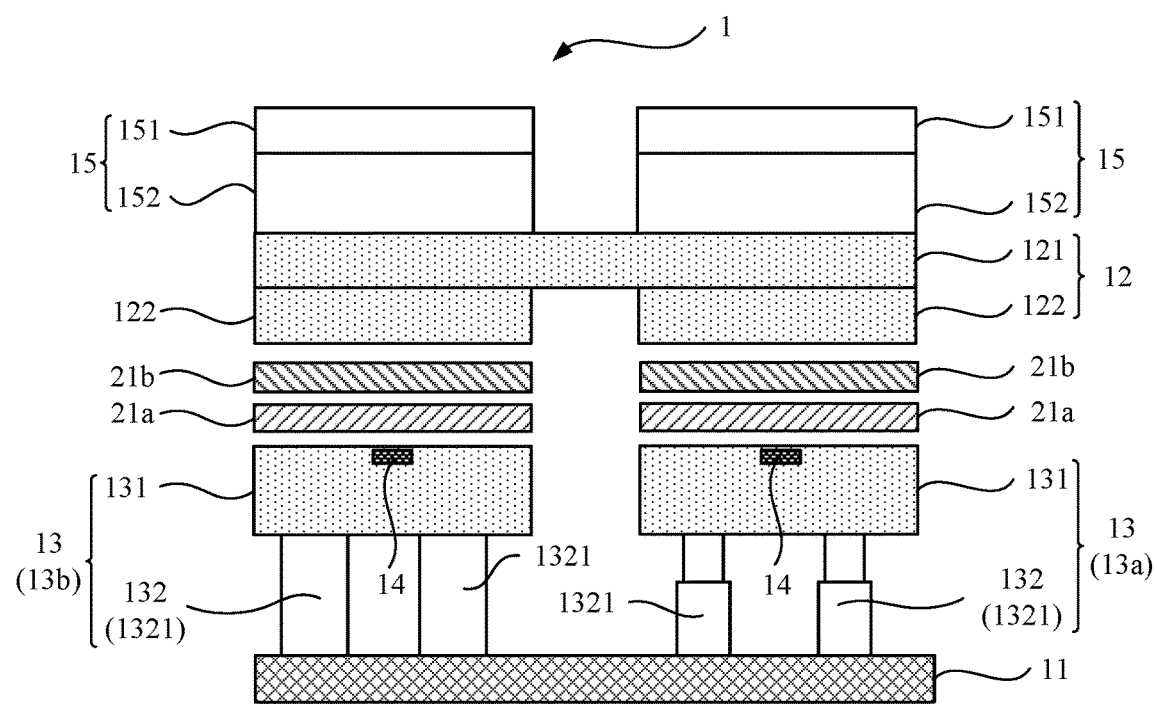
FIG. 13 is a schematic diagram of a structure of a fifth soldering apparatus according to Embodiment 3 of this application.

FIG. 13 is a schematic diagram of a structure of a fifth soldering apparatus according to Embodiment 3 of this application. As shown in FIG. 13, as an implementation, at least two lasers 15 may be provided in the soldering apparatus 1. Each of the lasers 15 is provided on the side of the pressing plate assembly 12 that faces away from the base plate 11. For example, each of the lasers 15 is provided on a side surface of the substrate 121 of the pressing plate assembly 12 that faces away from the base plate 11. The lasers 15 are in a one-to-one correspondence with the bearing seats 13. An out-light surface of each laser 15 corresponds to each workbench 131. For example, the laser glass 152 of each laser 15 directly faces the workbench 131.

With the plurality of lasers 15 in a one-to-one correspondence with the workbenches 131 of the bearing seats 13 provided above the pressing plate assembly 12, the out-light surface of each laser 15 is aligned with each workbench 131, and laser light emitted by each laser 15 is concentrated and irradiated onto the workbench 131, to heat each circuit board assembly 21 on the workbench 131 in a centralized manner. This can improve efficiency of heating the circuit board assembly 21, increase a soldering speed of the circuit board assembly 21, and improve soldering efficiency of the soldering apparatus 1.

In practical application, when the PCB 211 is manufactured and processed, a PCB 211 with a large area is usually formed first, and then the large PCB 211 is cut into a plurality of small PCBs 211 that meet requirements. Therefore, in the plurality of lasers 15 provided in the soldering apparatus 1, some of the lasers 15 may be used to implement a heating function on the circuit board assembly 21 on the workbench 131 and the other of the lasers 15 may be used to implement a cutting function on the PCB 211.

Figure 14:
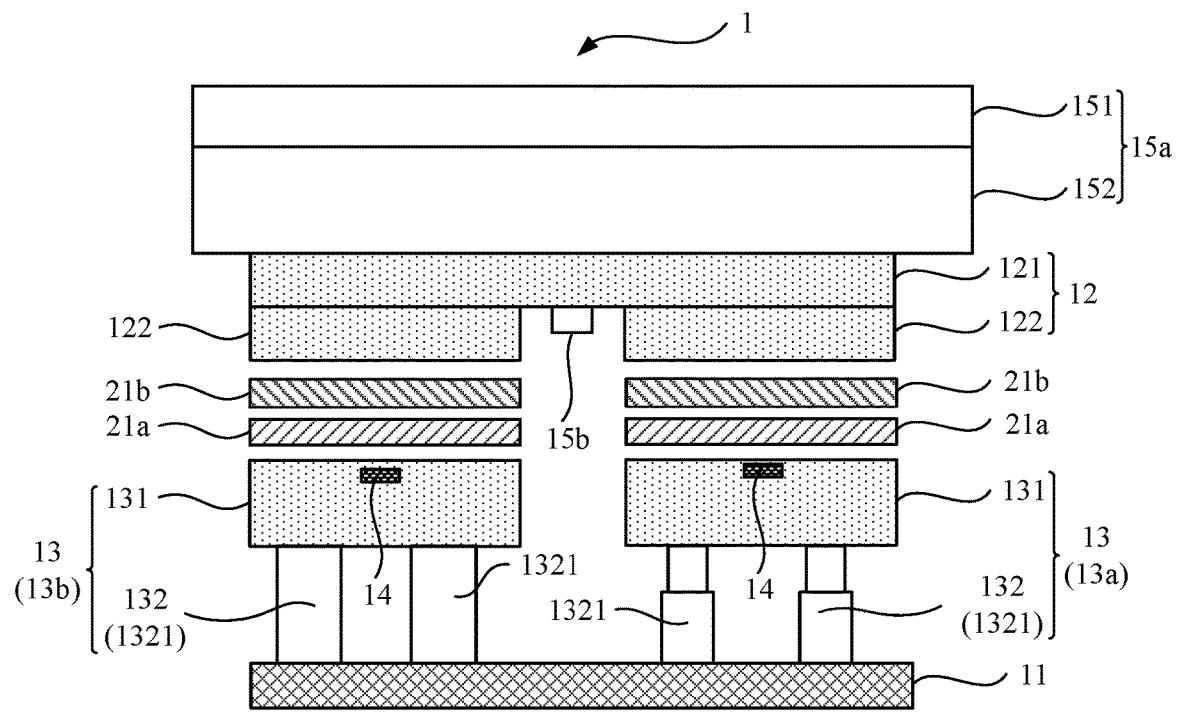
FIG. 14 is a schematic diagram of a structure of a sixth soldering apparatus according to Embodiment 3 of this application.

FIG. 14 is a schematic diagram of a structure of a sixth soldering apparatus according to Embodiment 3 of this application. As shown in FIG. 14, specifically, the plurality of lasers 15 may include a first laser 15a and a second laser 15b.

The first laser 15a may be the foregoing laser 15 provided on the side of the pressing plate assembly 12 that faces away from the base plate 11. The first laser 15a is configured to implement the heating function on the circuit board assembly 21 on the workbench 131. As shown in FIG. 14, the pressing plate assembly 12 is provided with one first laser 15a. The first laser 15a covers the workbenches 131 of all the bearing seats 13, and laser light emitted by the first laser 15a can be irradiated onto the circuit board assemblies 21 on the workbenches 131. In another example, the pressing plate assembly 12 may alternatively be provided with a plurality of first lasers 15a, and each first laser 15a corresponds to the workbench 131 of each bearing seat 13. Details are not described herein.

The second laser 15b may be provided on a side of the pressing plate assembly 12 that faces the base plate 11, and the second laser 15b is located in a gap between adjacent bearing seats 13. For example, the second laser 15b is provided on the side surface of the substrate 121 that faces the base plate 11, and the second laser 15b is located in a gap between adjacent separate plates 122. Laser light emitted by the second laser 15b is irradiated onto a region of the PCB 211 that extends out of the workbench 131, so as to cut the PCB 211 from a corresponding part. For this, when the PCB 211 is placed before soldering, a region to be cut on the PCB 211 may be correspondingly placed in the gap between adjacent bearing seats 13, so that the laser light emitted by the second laser 15b is directly irradiated onto the region to be cut on the PCB 211, to perform laser cutting on the PCB 211.

For example, the PCB 211 to be cut may be the foregoing integral PCB 211 covering a plurality of workbenches 131, and the FPCs 212 on the workbenches 131 are soldered to different regions of the PCB 211. The second laser 15b is configured to cut a region on the PCB 211 that corresponds to a gap between adjacent workbenches 131. Alternatively, the PCB 211 to be cut is the PCB 211 corresponding to each workbench 131, and the second laser 15b is configured to cut a region of the PCB 211 that extends out of the workbench 131.

It can be understood that, a plurality of second lasers 15b may be spaced on the side surface of the substrate 121 that faces the base plate 11. Each of the second lasers 15b is provided in a gap between adjacent separate plates 122. The second laser 15b may be provided between the separate plates 122 of all adjacent bearing seats 13, or the second laser 15b may be provided between the separate plates 122 of some adjacent bearing seats 13.

Embodiment 4

On the basis of Embodiment 1 and Embodiment 2, this embodiment provides a soldering apparatus 1 to improve efficiency of heating the circuit board assembly 21 by the soldering apparatus 1 and increase a soldering speed of the circuit board assembly 21. In the soldering apparatus 1 provided in this embodiment, a heating structure is further provided corresponding to each bearing seat 13, so that each bearing seat 13 is centrally heated by using the heating structure on the bearing seat 13, thereby improving the heating efficiency of the circuit board assembly 21 on the bearing seat 13.

Figure 15:
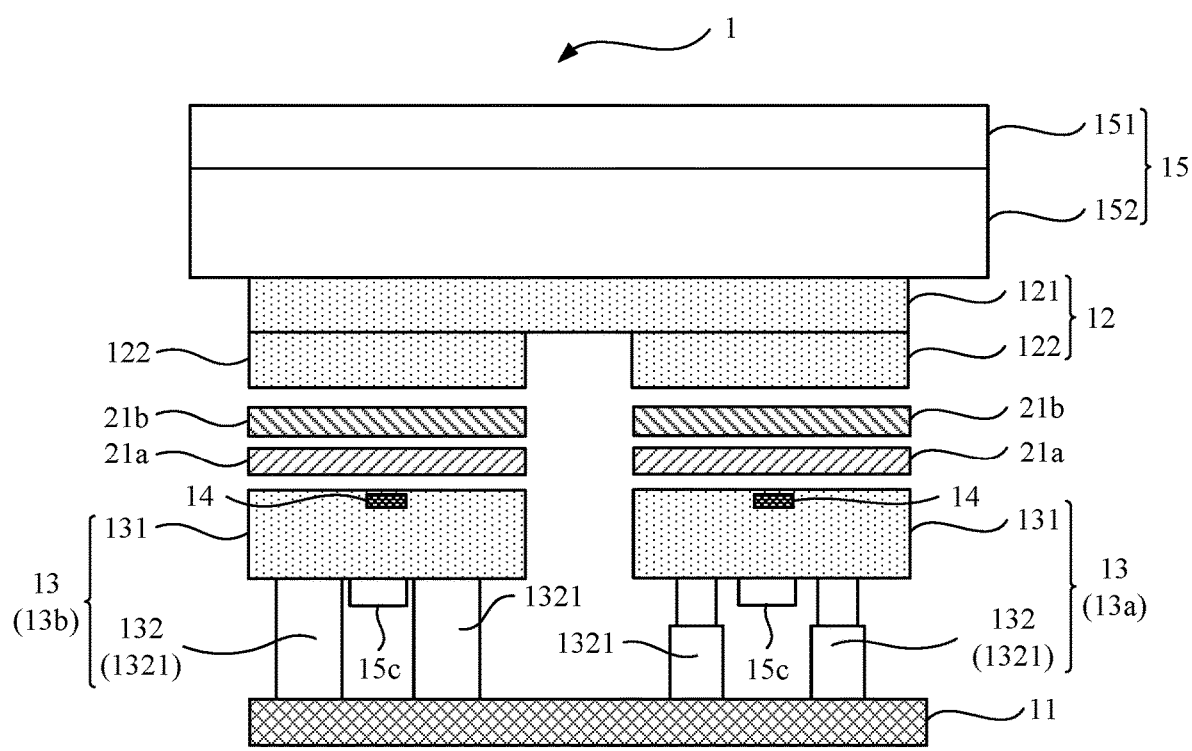
FIG. 15 is a schematic diagram of a structure of a seventh soldering apparatus according to Embodiment 4 of this application.

FIG. 15 is a schematic diagram of a structure of a seventh soldering apparatus according to Embodiment 4 of this application. As shown in FIG. 15, on the basis that the circuit board assembly 21 on the workbench 131 of each bearing seat 13 is heated through the pressing plate assembly 12 by the laser 15 on the pressing plate assembly 12, the laser 15 may be further provided corresponding to each bearing seat 13, so as to increase the heating speed of the circuit board assembly 21 on the workbench 131 of the bearing seat 13 and increase the soldering speed of the circuit board assembly 21.

Specifically, a third laser 15c may be provided on each bearing seat 13, and the third laser 15c is located between the workbench 131 and the base plate 11. For example, the third laser 15c may be provided on a side surface of the workbench 131 that faces the base plate 11. The workbench 131 may be a workbench 131 with good light transmission, and a material for forming the workbench 131 may be, for example, glass or plastic with good light transmission and good thermal stability. Laser light emitted by the third laser 15c penetrates the workbench 131 and is irradiated onto the circuit board assembly 21 on the workbench 131, to heat the circuit board assembly 21.

As shown in FIG. 15, the laser 15 located above the pressing plate assembly 12 heats one side surface of the circuit board assembly 21, and the third laser 15c located below the workbench 131 heats the other side surface of the circuit board assembly 21. By simultaneously heating both sides of the circuit board assembly 21, the efficiency of heating the circuit board assembly 21 by the soldering apparatus 1 is improved, the soldering speed of the circuit board assembly 21 is increased, and the soldering efficiency of the soldering apparatus 1 is improved.

Figure 16:
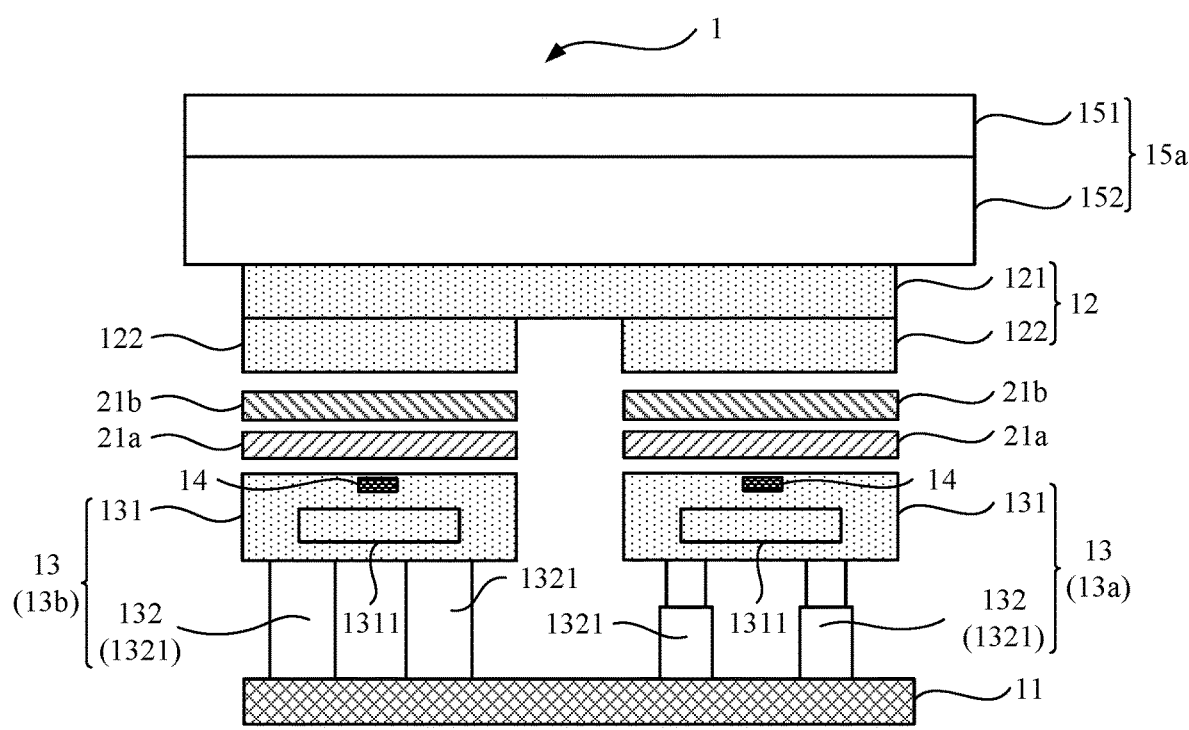
FIG. 16 is a schematic diagram of a structure of an eighth soldering apparatus according to Embodiment 4 of this application.

FIG. 16 is a schematic diagram of a structure of an eighth soldering apparatus according to Embodiment 4 of this application. As shown in FIG. 16, a heater 1311 may be further provided in each workbench 131 in addition to providing the laser 15 below the workbench 131 of each bearing seat 13 and heating the circuit board assembly 21 on the workbench 131 by using the energy of the laser light. The heater 1311 may be, for example, an electric heater, and heat generated by the heater 1311 may be transferred to the work surface of the workbench 131, so as to heat the circuit board assembly 21 on the workbench 131. The heater 1311 in each workbench 131 cooperates with the laser 15 on the pressing plate assembly 12 to simultaneously heat both sides of the circuit board assembly 21. This increases heating efficiency and a soldering speed of the circuit board assembly 21 and improves soldering efficiency of the soldering apparatus 1.

In addition, it can be understood that, the soldering apparatus 1 provided in this embodiment may be further provided with the second laser 15b for cutting the PCB 211 in the foregoing Embodiment 3, and details are not described herein again.

Embodiment 5

On the basis of Embodiment 1 and Embodiment 2, this embodiment provides a soldering method for the circuit board assembly 21 (referred to as soldering method for short below). The soldering method is applied to the soldering apparatus 1 in Embodiment 1 or Embodiment 2.

Figure 17:
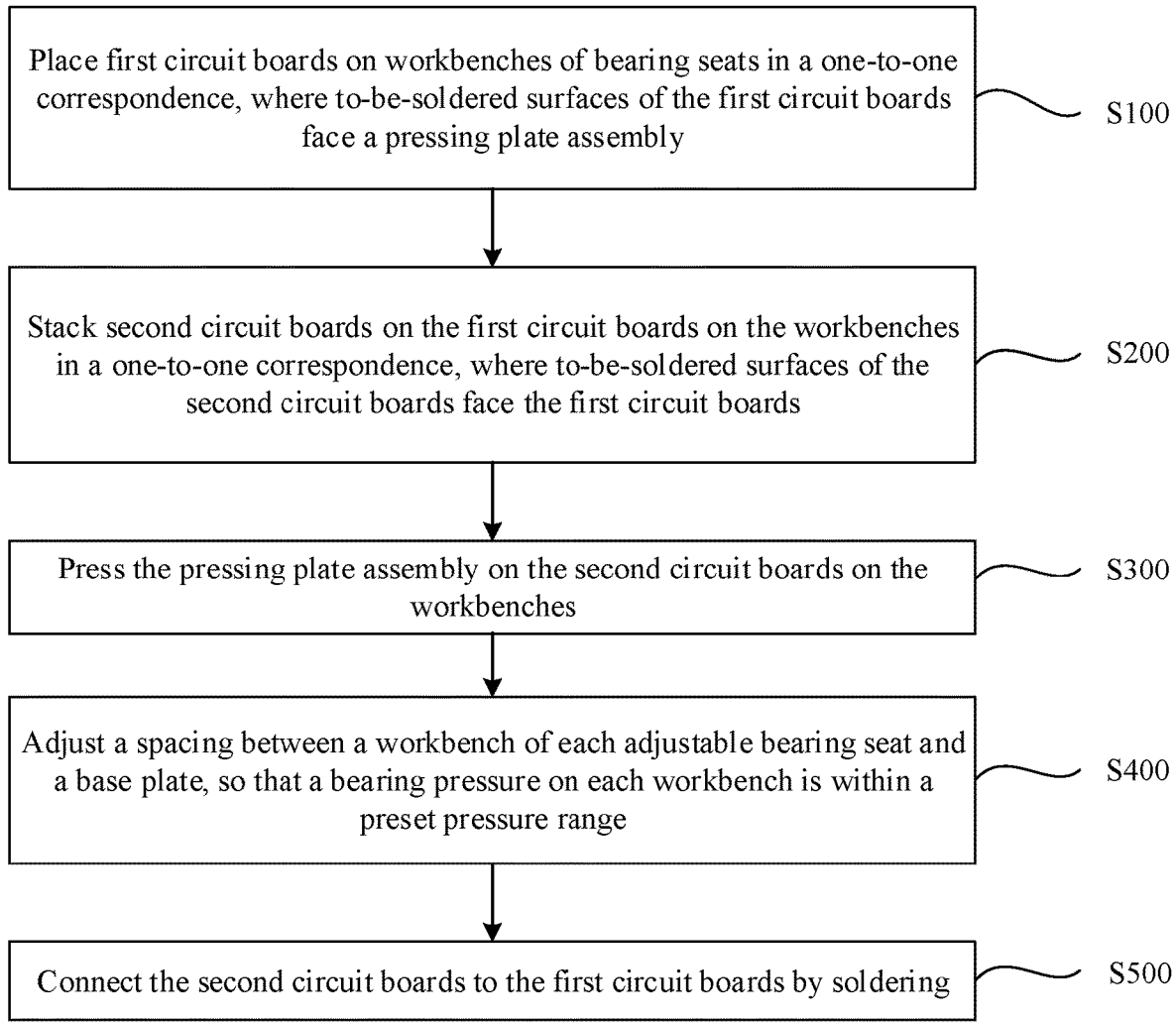
FIG. 17 is a schematic flowchart of a circuit board assembly soldering method according to Embodiment 5 of this application.

FIG. 17 is a schematic flowchart of a circuit board assembly soldering method according to Embodiment 5 of this application. As shown in FIG. 17, the soldering method includes the following steps.

S100: Place first circuit boards on workbenches of bearing seats in a one-to-one correspondence, where to-be-soldered surfaces of the first circuit boards face a pressing plate assembly.

With reference to FIG. 8, the first circuit boards 21a are first placed on the workbenches 131 of the bearing seats 13, so that the to-be-soldered surfaces of the first circuit boards 21a face upward, that is, the to-be-soldered surfaces of the first circuit boards 21a face the pressing plate assembly 12 above the workbenches 131.

For example, the first circuit boards 21a are PCBs 211. The PCBs 211 are first placed on the workbenches 131, and side surfaces of the PCBs 211 that are each provided with the pads 2113 face upward. It can be understood that, the solder paste 2114 may be pre-printed on the pads 2113 for each PCB 211. The workbench 131 is generally provided with a positioning region. After the PCB 211 is placed in the positioning region on the workbench 131, an additional layer of solder flux may be coated on the solder paste 2114 of the PCB 211.

Alternatively, the first circuit boards 21a may be FPCs 212. The FPCs 212 are first placed on the workbenches 131, and side surfaces of the FPCs 212 that are each provided with the solder pins 2122 face upward.

S200: Stack second circuit boards on the first circuit boards on the workbenches in a one-to-one correspondence, where to-be-soldered surfaces of the second circuit boards face the first circuit boards.

After the first circuit boards 21a are properly placed, the second circuit boards 21b are stacked on the first circuit boards 21a, and to-be-soldered surfaces of the second circuit boards 21b face the first circuit boards 21a.

For example, the first circuit boards 21a are PCBs 211 and the second circuit board 21b are FPCs 212. After the PCBs 211 are properly placed on the workbenches 131, the FPCs 212 are placed on the PCBs 211. A region on the FPC 212 that is centrally provided with the solder pins 2122 is located corresponding to the soldering region 211a on the PCB 211. For example, the first circuit boards 21a are FPCs 212 and the second circuit board 21b are PCBs 211. After the FPCs 212 are properly placed on the workbenches 131, the PCBs 211 are stacked on the FPCs 212, so that the soldering region 211a of each PCB 211 corresponds to a region on the FPC 212 that is provided with the solder pins 2122.

Further, it should be noted that, after the circuit board assembly 21 is properly placed and before the circuit board assembly 21 is soldered, it is necessary to adjust the height of the workbench 131 of each adjustable bearing seat 13a. Therefore, for a case in which the PCB 211 is the foregoing integral PCB 211, the PCB 211 covers the workbenches 131, and the FPCs 212 are soldered to different regions on the PCB 211, the first circuit boards 21a may be the FPCs 212 and the second circuit board 21b may be the PCB 211. The FPCs 212 may be first placed on the workbenches 131, and then the integral PCB 211 may be stacked on the FPCs 212, to avoid damage to the integral PCB 211 when the workbench 131 of each adjustable bearing seat 13a is adjusted.

S300: Press the pressing plate assembly on the second circuit boards on the workbenches.

After the circuit board assembly 21 is properly placed, a spacing between the workbench 131 and the pressing plate assembly 12 is adjusted, so that the pressing plate assembly 12 is pressed on the second circuit board 21b on the workbench 131. For example, the pressing plate assembly 12 is pressed on each FPC 212 or each PCB 211, or the pressing plate assembly 12 is pressed on the integral PCB 211.

In this case, the pressing plate assembly 12 can play only a pre-pressing function. The height of the pressing plate assembly 12 may be fixed, and the pressure borne by the circuit board assembly 21 on each workbench 131 may be less than a pressure range required for soldering. Alternatively, the pressure borne by the circuit board assembly 21 on only one or some of the workbenches 131 may be within the pressure range required for soldering, while the pressure borne by the circuit board assembly 21 on a remaining workbench 131 may be less than the pressure range required for soldering.

For example, a pressure required for soldering is 8-20 N. In this case, the pressure borne by the circuit board assembly 21 on each workbench 131 may be less than 8 N, or the pressure borne by the circuit board assembly 21 on only one or some of the workbenches 131 may be within the range of 8-20 N, while the pressure borne by the circuit board assembly 21 on a remaining workbench 131 may be less than 8 N.

S400: Adjust a spacing between a workbench of each adjustable bearing seat and a base plate, so that a bearing pressure on each workbench is within a preset pressure range.

After the pressing plate assembly 12 is properly positioned, the height of the workbench 131 of each adjustable bearing seat 13a is adjusted based on the pressures on the workbenches 131 of different adjustable bearing seats 13a, so that the bearing pressure on the workbench 131 of each adjustable bearing seat 13a is within the preset pressure range. The preset pressure range is a pressure range required for soldering, for example, the preset pressure range is 8-20 N.

It should be noted that, there is no need to make the bearing pressures on the workbenches 131 of all the bearing seats 13 totally the same, provided that the bearing pressure on the workbench 131 of each bearing seat 13 is within the preset pressure range and soldering requirements of the circuit board assembly 21 are met.

Specifically, with reference to FIG. 8, for example, all the bearing seats 13 are adjustable bearing seats 13a. The pressing plate assembly 12 is pressed on the second circuit board 21b on each workbench 131. After the height of the pressing plate assembly 12 is fixed, the bearing pressure on one or some of the workbenches 131 is made within the preset pressure range, while the bearing pressure on a remaining workbench 131 is made less than a minimum pressure value in the preset pressure range. Alternatively, the bearing pressures on all the workbenches are less than the minimum pressure value within the preset pressure range.

Then, the height of the workbench 131 whose bearing pressure is less than the minimum pressure value within the preset pressure range is increased. In other words, the spacing between the workbench 131 and the base plate 11 is increased, and the spacing between the workbench 131 and the pressing plate assembly 12 is reduced, to increase the bearing pressure on the workbench 131. In this way, after the bearing pressure on the workbench 131 reaches the preset pressure range, the height of the workbench 131 is fixed.

When the pressing plate assembly 12 is properly positioned, before the height of the workbench 131 of each adjustable bearing seat 13*a* is adjusted, the bearing pressure on the workbench 131 of each adjustable bearing seat 13*a* is controlled to not exceed a maximum pressure value within the preset pressure range, to avoid damage caused by an excessively large pressure to the circuit board assembly 21.

Since all the bearing seats 13 are adjustable bearing seats 13*a* and the height of the workbench 131 of each bearing seat 13 is adjustable, the pressing plate assembly 12 may be provided as a pressing plate assembly 12 with a fixed height, or the pressing plate assembly 12 may be a pressing plate assembly 12 with a variable height. This is not limited in this embodiment.

For example, the bearing pressure on the workbench 131 of each adjustable bearing seat 13*a* may be detected in real time by using the pressure sensor 14 in the workbench 131 of each adjustable bearing seat 13*a*.

With reference to FIG. 11, for example, the bearing seats 13 include one fixed bearing seat 13*b*, the height of the workbench 131 of the fixed bearing seat 13*b* is unadjustable, and a remaining bearing seat 13 is an adjustable bearing seat 13*a*. The pressing plate assembly 12 may be a pressing plate assembly 12 with a variable height. Before soldering operations are performed, the height of the workbench 131 of each adjustable bearing seat 13*a* may be less than the height of the workbench 131 of the fixed bearing seat 13*b*. In other words, a spacing between the workbench 131 of each adjustable bearing seat 13*a* and the base plate 11 is less than the spacing between the workbench 131 of the fixed bearing seat 13*b* and the base plate 11.

After the pressing plate assembly 12 is pre-pressed on the second circuit board 21*b* on each workbench 131 and the height of the pressing plate assembly 12 is fixed, the bearing pressure on the workbench 131 of the fixed bearing seat 13*b* needs to be made within the preset pressure range, and the bearing pressure on the workbench 131 of each adjustable bearing seat 13*a* needs to be made less than the minimum value within the preset pressure range. This avoids an excessively large initial pressure on the workbench 131 of the adjustable bearing seat 13*a* from causing damage to the circuit board assembly 21 on the workbench 131 of the adjustable bearing seat 13*a*.

Then, the height of the workbench 131 of each adjustable bearing seat 13*a* is gradually increased, so that the bearing pressure on the workbench 131 of each adjustable bearing seat 13*a* is increased, until the bearing pressure on the workbench 131 of each adjustable bearing seat 13*a* is within the preset pressure range and the height of the workbench 131 of each adjustable bearing seat 13*a* is fixed.

For example, the bearing pressure on the workbench 131 of each adjustable bearing seat 13*a* may be detected in real time by using the pressure sensor 14 in the workbench 131 of each adjustable bearing seat 13*a*. When the height of the pressing plate assembly 12 is fixed, a pressure between the pressing plate assembly 12 and the workbench 131 of the fixed bearing seat 13*b* may be detected by using the pressure sensor 14 on the pressing plate assembly 12, or the bearing pressure on the workbench 131 of the fixed bearing seat 13*b* may be detected in real time by using the pressure sensor 14 provided in the workbench 131 of the fixed bearing seat 13*b*.

S500: Connect the second circuit boards to the first circuit boards by soldering.

After the bearing pressure on the workbench 131 of each bearing seat 13 is adjusted to the preset pressure range, the soldering operations on the circuit board assembly 21 are started. The circuit board assembly 21 on the workbench 131 is heated by using the soldering apparatus 1, so that the solder paste 2114 on the pads 2113 of the PCB 211 is melted. In addition, pressures applied by pressing plate assembly 12 and the workbench 131 squeeze the molten solder paste 2114 and make the solder paste 2114 overflow to a side surface of the FPC 212 that faces away from the PCB 211, thereby implementing soldered connection between the PCB 211 and the FPC 212.

In the description of the embodiments of this application, it should be noted that, the terms "mounting", "connection", and "connect" should be understood in a broad sense unless otherwise expressly stipulated and limited. For example, "connection" may be a fixed connection, an indirect connection through an intermediate medium, internal communication between two elements, or an interaction relationship between two elements. For a person of ordinary skill in the art, specific meanings of the foregoing terms in the embodiments of this application can be understood based on specific situations.

The terms "first", "second", "third", "fourth", and the like (if any) in this specification, the claims, and the accompanying drawings of the embodiments of this application are used to distinguish between similar objects without having to describe a specific order or sequence.

What is claimed is:

1. A circuit board assembly soldering method, comprising:
   placing first circuit boards on workbenches of bearing seats in a one-to-one correspondence, wherein to-be-soldered surfaces of the first circuit boards face a pressing plate assembly;
   stacking second circuit boards on the first circuit boards on the workbenches in a one-to-one correspondence, wherein to-be-soldered surfaces of the second circuit boards face the first circuit boards;
   pressing the pressing plate assembly on the second circuit boards on the workbenches;
   adjusting a spacing between a workbench of each adjustable bearing seat and a base plate, so that a bearing pressure on each workbench is within a preset pressure range; and
   connecting the second circuit boards to the first circuit boards by melting solder paste on the circuit board assembly with at least one first laser;
   cutting at least one of the of the first circuit boards or the second circuit boards with at least one second laser; wherein
   the at least one first laser is provided on a side of the pressing plate assembly that faces away from the base plate, and laser light emitted by the at least one first laser penetrates the pressing plate assembly and is irradiated onto the circuit board assembly on the workbenches; and the at least one second laser is provided on a side of the pressing plate assembly that faces the base plate, and the at least one second laser is located in a gap between adjacent bearing seats.

2. The circuit board assembly soldering method according to claim 1, wherein each of the bearing seats is the adjustable bearing seat; and the pressing the pressing plate assembly on the second circuit boards on the workbenches, and the adjusting the spacing between the workbench of each adjustable bearing seat and a base plate, so that the bearing pressure on each workbench is within the preset pressure range specifically comprises:

pressing the pressing plate assembly on each of the second circuit boards, so that a bearing pressure on at least one workbench is within the preset pressure range, and a bearing pressure on the rest of the workbenches is less than a minimum pressure value within the preset pressure range, or so that bearing pressures on all the workbenches are less than a minimum pressure value within the preset pressure range; and increasing a spacing between the base plate and the workbench whose bearing pressure is less than the minimum pressure value within the preset pressure range, so that the bearing pressures on all the workbenches are within the preset pressure range.

3. The circuit board assembly soldering method according to claim 1, wherein the bearing seats comprise one fixed bearing seat; and the pressing the pressing plate assembly on the second circuit boards on the workbenches, and the adjusting the spacing between the workbench of each adjustable bearing seat and a base plate, so that the bearing pressure on each workbench is within the preset pressure range specifically comprises:

pressing the pressing plate assembly on each of the second circuit boards, so that a bearing pressure on a workbench of the fixed bearing seat is within the preset pressure range, and a bearing pressure on the workbench of each adjustable bearing seat is less than a minimum pressure value within the preset pressure range; and increasing the spacing between the workbench of each adjustable bearing seat and the base plate, so that the bearing pressure on the workbench of each adjustable bearing seat is within the preset pressure range.

4. The circuit board assembly soldering method according to claim 1, wherein one of a first circuit board of the first circuit boards and a second circuit board of the second circuit boards is a printed circuit board, and the other is a flexible circuit board.

5. A circuit board assembly soldering apparatus, comprising:

a base plate, a pressing plate assembly, at least two bearing seats, and at least two lasers, wherein the pressing plate assembly is oppositely provided above the base plate, the bearing seats are mounted on the base plate, and the bearing seats are located between the pressing plate assembly and the base plate; the bearing seats each comprise a workbench, the workbench is located on a side of the bearing seat that faces the pressing plate assembly, the workbench is configured to place the circuit board assembly, and the pressing plate assembly is configured to be pressed on the circuit board assembly located on the workbench; and the circuit board assembly comprises a first circuit board and a second circuit board that are stacked on the workbench in a one-to-one correspondence, and the second circuit board is located on a side of the first circuit board that faces away from the workbench; wherein the at least two bearing seats comprise at least one adjustable bearing seat, and a spacing between the workbench of the adjustable bearing seat and the base plate is adjustable;

the at least two lasers comprise at least one first laser and at least one second laser;

the at least one first laser is provided on a side of the pressing plate assembly that faces away from the base plate, and laser light emitted by the at least one first laser penetrates the pressing plate assembly and is irradiated onto the circuit board assembly on the workbench; and the at least one second laser is provided on a side of the pressing plate assembly that faces the base plate, and the at least one second laser is located in a gap between adjacent bearing seats.

6. The circuit board assembly soldering apparatus according to claim 5, wherein the at least two bearing seats each further comprise a support frame, the support frame is connected between the workbench and the base plate, and the support frame of the adjustable bearing seat is capable of adjusting a height of the workbench relative to the base plate.

7. The circuit board assembly soldering apparatus according to claim 6, wherein the support frame of the adjustable bearing seat comprises at least one support column, and the support column is supported on the base plate.

8. The circuit board assembly soldering apparatus according to claim 7, wherein the workbench of the adjustable bearing seat is fastened to a top end of the support column, and a height of the support column of the adjustable bearing seat is adjustable.

9. The circuit board assembly soldering apparatus according to claim 7, wherein the workbench of the adjustable bearing seat is movably connected to the support column and is capable of moving along an axial direction of the support column, and the workbench of the adjustable bearing seat is capable of being fastened to different parts of the support column.

10. The circuit board assembly soldering apparatus according to claim 9, wherein the support column of the adjustable bearing seat is inserted into the workbench, and a telescopic elastic part is sleeved outside the support column, and both ends of the elastic part respectively abut against the workbench and the base plate.

11. The circuit board assembly soldering apparatus according to claim 5, wherein the workbench of the adjustable bearing seat is internally provided with a pressure sensor.

12. The circuit board assembly soldering apparatus according to claim 5, wherein the at least two bearing seats comprise one fixed bearing seat, and a spacing between a workbench of the fixed bearing seat and the base plate is fixed.

13. The circuit board assembly soldering apparatus according to claim 12, wherein the pressing plate assembly is provided with a pressure sensor, or the workbench of the fixed bearing seat is provided with a pressure sensor.

14. The circuit board assembly soldering apparatus according to claim 5, wherein the pressing plate assembly comprises a substrate, the substrate is provided opposite to the base plate, and projections of workbenches of the bearing seats on the substrate each are located within a coverage area of the substrate.

15. The circuit board assembly soldering apparatus according to claim 14, wherein the pressing plate assembly further comprises at least two separate plates, each of the separate plates is provided on a surface on a side of the substrate that faces the base plate, the separate plates are in a one-to-one correspondence with the workbenches of the bearing seats, and the separate plates are pressed on the circuit board assembly on the workbenches; wherein a spacing exists between adjacent separate plates.

16. The circuit board assembly soldering apparatus according to claim 5, wherein an out-light surface of each of the at least one first laser is in a one-to-one correspondence with each of the workbenches.

17. The circuit board assembly soldering apparatus according to claim 5, wherein the at least two lasers comprise at least one third laser, the at least one third laser is located between the workbench and the base plate, an out-light surface of the at least one third laser faces the workbench, and laser light emitted by the at least one third laser is used to penetrate the workbench and be irradiated onto the circuit board assembly.

18. The circuit board assembly soldering apparatus according to claim 5, wherein a heater is provided in the workbench.

* * * * *